(12) United States Patent
Iio et al.

(10) Patent No.: US 12,197,127 B2
(45) Date of Patent: Jan. 14, 2025

(54) NEGATIVE PHOTOSENSITIVE RESIN COMPOSITION, PATTERNING PROCESS, METHOD FOR FORMING CURED FILM, INTERLAYER INSULATION FILM, SURFACE PROTECTIVE FILM, AND ELECTRONIC COMPONENT

(71) Applicant: SHIN-ETSU CHEMICAL CO., LTD., Tokyo (JP)

(72) Inventors: Masashi Iio, Joetsu (JP); Hiroyuki Urano, Joetsu (JP); Osamu Watanabe, Joetsu (JP); Katsuya Takemura, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/674,120

(22) Filed: Feb. 17, 2022

(65) Prior Publication Data
US 2022/0317570 A1    Oct. 6, 2022

(30) Foreign Application Priority Data

Mar. 23, 2021  (JP) .................................. 2021-49177

(51) Int. Cl.
*G03F 7/038* (2006.01)
*C08F 220/28* (2006.01)
(Continued)

(52) U.S. Cl.
CPC ........ *G03F 7/0387* (2013.01); *C08F 220/281* (2020.02); *C08G 73/1042* (2013.01); *C08G 73/14* (2013.01)

(58) Field of Classification Search
CPC ...... G03F 7/0387; G03F 7/0382; G03F 7/038; C08F 220/281; C08G 73/1042; C08G 73/14
See application file for complete search history.

(56) References Cited

U.S. PATENT DOCUMENTS

| | | | |
|---|---|---|---|
| 4,857,435 A | 8/1989 | Hopf et al. | |
| 5,059,513 A | 10/1991 | Hopf et al. | |

(Continued)

FOREIGN PATENT DOCUMENTS

| | | | |
|---|---|---|---|
| EP | 1 772 468 A1 | 4/2007 | |
| EP | 3 235 803 A1 | 10/2017 | |

(Continued)

OTHER PUBLICATIONS https://www.honshuchemical.co.jp/en/products/search/91-04-3.html (Year: 2023).*

(Continued)

*Primary Examiner* — Sean M DeGuire
*Assistant Examiner* — Alexander N. Lee
(74) *Attorney, Agent, or Firm* — Oliff PLC

(57) ABSTRACT

A negative photosensitive resin composition including: an alkali-soluble resin containing at least one structure selected from a polyimide structure, a polyamide structure, a polybenzoxazole structure, a polyamide-imide structure, and a precursor structure thereof, a polymer compound having a structural unit formed by cyclopolymerization, a compound that generates an acid by light, and a heat crosslinking agent.

13 Claims, 1 Drawing Sheet

(51) Int. Cl.
    *C08G 73/10* (2006.01)
    *C08G 73/14* (2006.01)

(56) References Cited

U.S. PATENT DOCUMENTS

| | | | |
|---|---|---|---|
| 10,175,577 B2 | 1/2019 | Tahara et al. | |
| 2003/0194644 A1 | 10/2003 | Hatakeyama et al. | |
| 2003/0194645 A1 | 10/2003 | Harada et al. | |
| 2006/0079658 A1 | 4/2006 | Kato et al. | |
| 2006/0246377 A1 | 11/2006 | Yamato et al. | |
| 2007/0020555 A1 | 1/2007 | Matsumura et al. | |
| 2012/0052441 A1 | 3/2012 | Sagehashi et al. | |
| 2012/0129103 A1* | 5/2012 | Ohsawa | G03F 7/2041 430/326 |
| 2017/0045818 A1 | 2/2017 | Karasawa et al. | |
| 2017/0298186 A1 | 10/2017 | Takemura et al. | |
| 2018/0031970 A1 | 2/2018 | Arimoto et al. | |
| 2018/0305552 A1 | 10/2018 | Matsumura et al. | |
| 2018/0342386 A1 | 11/2018 | Onishi et al. | |
| 2019/0169211 A1 | 6/2019 | Urano et al. | |
| 2019/0241716 A1 | 8/2019 | Komori et al. | |
| 2020/0041903 A1 | 2/2020 | Takemura et al. | |
| 2021/0284839 A1 | 9/2021 | Komori et al. | |

FOREIGN PATENT DOCUMENTS

| | | | | |
|---|---|---|---|---|
| JP | S60-115932 A | | 6/1985 | |
| JP | H02-60941 A | | 3/1990 | |
| JP | H02-99537 A | | 4/1990 | |
| JP | H02-115238 A | | 4/1990 | |
| JP | H11-100378 A | | 4/1999 | |
| JP | 2001310937 A | * | 11/2001 | |
| JP | 2003-055362 A | | 2/2003 | |
| JP | 2003-231860 A | | 8/2003 | |
| JP | 2005-008847 A | | 1/2005 | |
| JP | 2005-018012 A | | 1/2005 | |
| JP | 2005-146038 A | | 6/2005 | |
| JP | 2005-290052 A | | 10/2005 | |
| JP | 2006-199790 A | | 8/2006 | |
| JP | 3824286 B2 | | 9/2006 | |
| JP | 2006-273748 A | | 10/2006 | |
| JP | 2006-313237 A | | 11/2006 | |
| JP | 2006-348252 A | | 12/2006 | |
| JP | 2007-199653 A | | 8/2007 | |
| JP | 2008-24920 A | | 2/2008 | |
| JP | 2010-174195 A | | 8/2010 | |
| JP | 4530284 B2 | | 8/2010 | |
| JP | 5609815 B2 | | 10/2014 | |
| JP | 2015-102612 A | | 6/2015 | |
| JP | 2015-129791 A | | 7/2015 | |
| JP | 2015-200819 A | | 11/2015 | |
| JP | 5884837 B2 | | 3/2016 | |
| JP | 2016079371 A | * | 5/2016 | |
| JP | 5987984 B2 | | 9/2016 | |
| JP | 2017-044964 A | | 3/2017 | |
| JP | 6315204 B2 | | 4/2018 | |
| JP | 6414060 B2 | | 10/2018 | |
| JP | 2019-045622 A | | 3/2019 | |
| JP | 2019-099516 A | | 6/2019 | |
| JP | 6601628 B2 | | 11/2019 | |
| JP | 2020-023666 A | | 2/2020 | |
| JP | 2020-064148 A | | 4/2020 | |
| JP | 6694230 B2 | | 5/2020 | |
| JP | 2020-170103 A | | 10/2020 | |
| KR | 2002-0048511 A | | 6/2002 | |
| KR | 10-1807630 B1 | | 7/2016 | |
| KR | 10-2019-0080865 A | | 7/2019 | |
| WO | 2004/074242 A2 | | 9/2004 | |
| WO | WO-2014038576 A1 | * | 3/2014 | C08F 220/26 |
| WO | 2016/140024 A1 | | 9/2016 | |
| WO | 2016/158150 A1 | | 10/2016 | |
| WO | 2017/170032 A1 | | 10/2017 | |
| WO | 2017/188153 A1 | | 11/2017 | |
| WO | WO-2018084149 A1 | * | 5/2018 | C08F 8/48 |
| WO | WO-2019026549 A1 | * | 2/2019 | C08F 220/26 |
| WO | 2020/202691 A1 | | 10/2020 | |
| WO | 2021/006315 A1 | | 1/2021 | |

OTHER PUBLICATIONS https://www.chemicalbook.com/ChemicalProductProperty_EN_CB3495524.htm (Year: 2023).*
https://www.chemicalbook.com/ChemicalProductProperty_EN_CB3258080.htm (Year: 2023).*
Yu, Douglas, "A New Integration Technology Platform: Integrated Fan-Out Wafer-Level-Packaging for Mobile Applications", Symposium on VLSI Technology Digest of Technical Papers, (2015), T46-47.
Kurita, Yoichiro et al., "Fan-Out Wafer-Level Packaging with Highly Flexible Design Capabilities", Proceedings of Electronic System-integration Technology Conference, (2010), pp. 1-6.
Braun, T. et al., "Large Area Compression Molding for Fan-out Panel Level Packing", Electronic Components & Technology Conference, (2015), pp. 1077-1083.
U.S. Appl. No. 17/674,136, filed Feb. 17, 2022 in the name of Iio et al.
Sep. 15, 2022 Extended Search Report issued in European Patent Application No. 22159695.0.
Sep. 2, 2022 Extended Search Report issued in European Patent Application No. 22159629.9.
Jul. 19, 2023 Office Action issued in U.S. Appl. No. 17/674,136.
Jan. 23, 2024 Office Action issued in Japanese Application No. 2021-049195.
Jan. 24, 2024 U.S. Office Action issued in U.S. Appl. No. 17/674,136.
Jan. 8, 2024 Office Action issued in Korean Application No. 10-2022-0031760.
Mar. 4, 2024 Office Action issued in Korean Application No. 10-2022-0031738.
Nov. 12, 2024 Office Action issued in Japanese Patent Application No. 2022-014785.

* cited by examiner

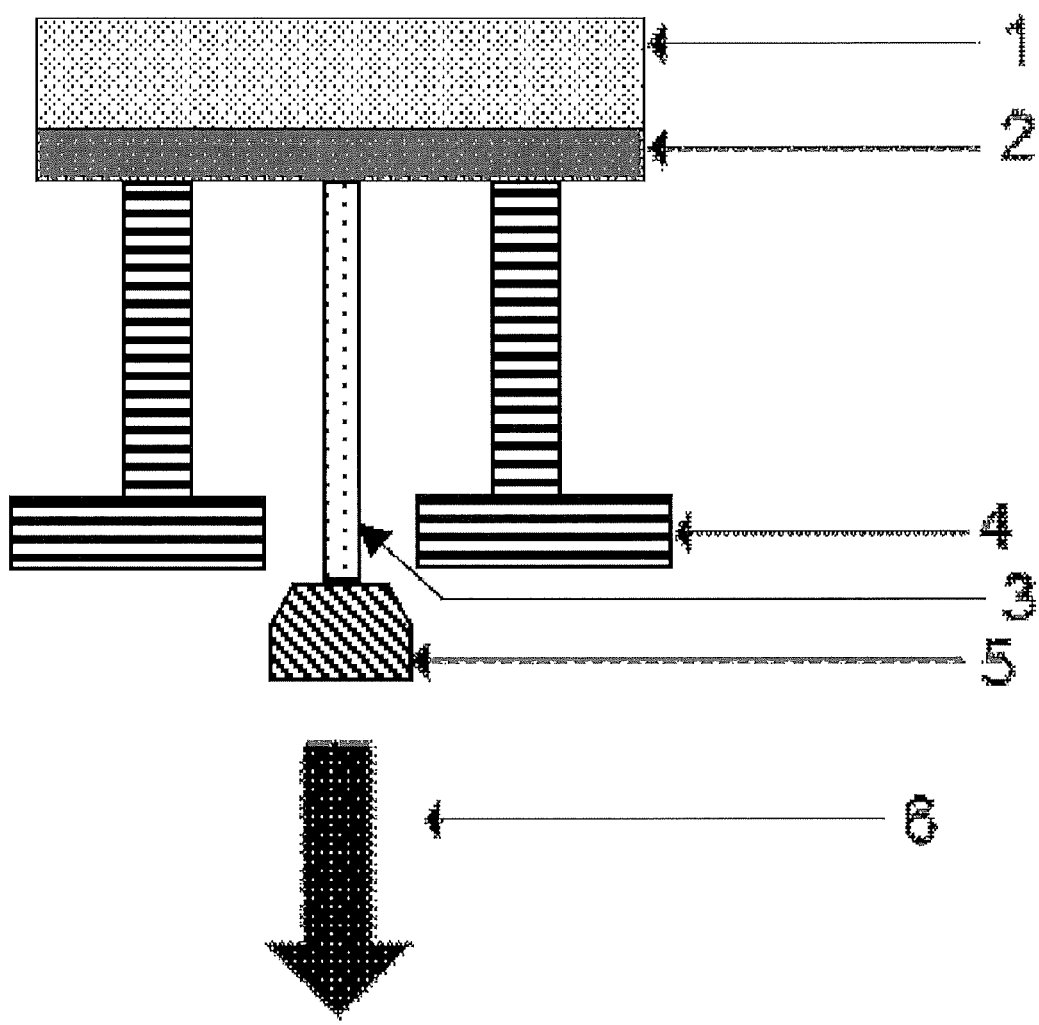

NEGATIVE PHOTOSENSITIVE RESIN COMPOSITION, PATTERNING PROCESS, METHOD FOR FORMING CURED FILM, INTERLAYER INSULATION FILM, SURFACE PROTECTIVE FILM, AND ELECTRONIC COMPONENT

TECHNICAL FIELD

The present invention relates to: a negative photosensitive resin composition; a patterning process capable of developing with an alkaline aqueous solution that uses the negative photosensitive resin composition; a method for forming a cured film; an interlayer insulation film; a surface protective film; and an electronic component.

BACKGROUND ART

As miniaturization and higher performance of various electronic devices such as personal computers, digital cameras, and mobile phones advance, a demand for further miniaturization, thinning, and higher density in semiconductor devices are also increasing rapidly. Accompanying these, it is demanded for interlayer insulation films and surface protective films of semiconductor devices to combine excellent electric characteristics, heat resistance, mechanical characteristics, and the like.

In a high-density mounting technology such as a three-dimensional lamination, as a photosensitive insulation material capable of forming a pattern on a substrate, a polyimide film has been utilized as a protective film or an insulation layer, its insulation property, mechanical characteristics, adhesiveness with a substrate, and so forth have continued to draw attention, and its development is active even now.

To improve the required properties further, various approaches are taken. In particular, a photosensitive resin composition has been proposed, which uses a closed-ring polyimide resin in order to lower a post-curing temperature (Patent Document 1, Patent Document 2). However, it is difficult to achieve all of the physical properties of the cured film such as resolution, mechanical characteristics (elongation and tensile strength), and adhesion, and there is room for improvement.

In addition, to improve the mechanical strength of a cured film, addition of a (meth)acrylic resin is proposed for achieving both lithography characteristics and physical properties of the cured film (Patent Document 3, Patent Document 4, Patent Document 5). However, since the modification of a main resin is the object, the mechanical strength of the cured film has room for improvement.

Meanwhile, as an improvement thereof, studies are being conducted on resins, besides polyimide, precursors thereof, polybenzoxazole, and precursors thereof, the resins having a structural unit derived from a cyclic olefin (a norbornene-type monomer, maleic anhydride, maleimide, etc.) or a cyclic structure introduced into a main chain skeleton as in a cyclopolymerization monomer unit (Patent Document 6, Patent Document 7, Patent Document 8, Patent Document 9).

Patent Document 6 and Patent Document 7 propose a positive photosensitive resin composition having an alkali-soluble resin containing an N-hydroxymaleimide unit and a norbornene unit, and in addition, a novolak resin added and using a quinonediazide compound. However, there is no detailed study regarding miniaturization, and there is no mention of the physical properties of the cured film.

Patent Document 8 proposes a negative photosensitive resin composition using a copolymer including a (meth)acrylate unit and maleimide, a compound having a polymerizable group having 2 or more functional groups, and a photopolymerization initiator. However, there is no description regarding resolution of fine patterns or mechanical strength.

Meanwhile, Patent Document 9 proposes a negative photosensitive resin composition using a copolymer containing a monomer having an acid radical introduced to a side chain, a maleimide, and a cyclic cyclized monomer, and using an alkali-soluble resin having an unsaturated double bond introduced to an acid radical of a side chain, and a photopolymerization initiator. The material is excellent in mechanical characteristics such as elastic recovery and breaking strength of the cured film. However, due to photosensitive characteristics where radical crosslinking is employed, there is room for improvement regarding miniaturization.

Thus, hereafter, as higher densification and higher integration of chips proceed, the miniaturization of patterns in a rewiring technology of the insulation protective film further proceeds. Accordingly, as the photosensitive resin composition, there is strong demand for a composition that can realize high resolution without damaging excellent features of the mechanical characteristics of a protective film obtained by low-temperature heating.

CITATION LIST

Patent Literature

Patent Document 1: JP 4530284 B
Patent Document 2: JP 2006-313237 A
Patent Document 3: JP 5884837 B
Patent Document 4: JP 2015-129791 A
Patent Document 5: JP 2015-200819 A
Patent Document 6: JP 2019-045622 A
Patent Document 7: JP 2020-170103 A
Patent Document 8: JP 6315204 B
Patent Document 9: JP 6694230 B

SUMMARY OF INVENTION

Technical Problem

The present invention has been made in view of the above-described circumstances, and an object thereof is to provide a negative photosensitive resin composition that is soluble in an alkaline aqueous solution, that allows formation of a fine pattern and can achieve high resolution, and that has excellent mechanical characteristics such as rupture elongation and tensile strength even when cured in a wide temperature range of a low temperature range.

Solution to Problem

To achieve the object, the present invention provides a negative photosensitive resin composition comprising:
(A) an alkali-soluble resin containing at least one structure selected from a polyimide structure, a polyamide structure, a polybenzoxazole structure, a polyamide-imide structure, and a precursor structure thereof;
(B) a polymer compound having a structural unit formed by cyclopolymerization;
(C) a compound that generates an acid by light; and
(D) a heat crosslinking agent.

Such a negative photosensitive resin composition is soluble in an alkaline aqueous solution, enables formation of a fine pattern and high resolution, and has excellent mechanical characteristics such as rupture elongation and tensile strength even when cured in a wide temperature range of a low temperature range.

Furthermore, in the inventive negative photosensitive resin composition, the structural unit formed by cyclopolymerization in the component (B) is preferably at least one structural unit represented by the following general formula (1), the following general formula (2), the following general formula (3), and the following general formula (4),

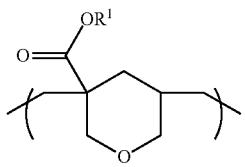
(1)

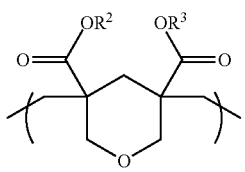
(2)

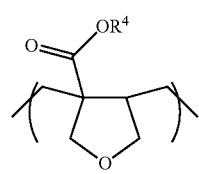
(3)

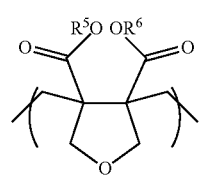
(4)

wherein $R^1$, $R^2$, $R^3$, $R^4$, $R^5$, and $R^6$ each independently represent a hydrogen atom or a linear or branched alkyl group having 1 to 5 carbon atoms.

When the main chain has a ring structure as described, mechanical characteristics such as rupture elongation and tensile strength are excellent, and furthermore, heat resistance is enhanced even when cured at low temperatures.

Furthermore, in the inventive negative photosensitive resin composition, the component (B) is preferably an alkali-soluble polymer compound further containing a structural unit represented by the following general formula (5) or (5'),

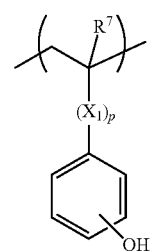
(5)

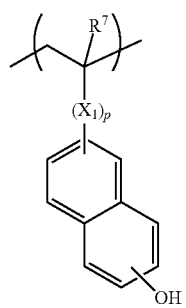
(5')

wherein $R^7$ represents a hydrogen atom or a methyl group; each $X_1$ represents —C(=O)—O—, —C(=O)—O—$R^8$—, —C(=O)—NH—, —C(=O)—NH—$R^8$—, or —C(=O)—N($R^8$OH)—; $R^8$ represents a divalent linear, branched, or cyclic aliphatic saturated hydrocarbon group having 1 to 12 carbon atoms or an aromatic hydrocarbon group having 6 to 12 carbon atoms, wherein a carbon atom of the aliphatic saturated hydrocarbon group is optionally substituted with an oxygen atom; a hydrogen atom of an aromatic hydrocarbon group in the formulae is optionally substituted with a methyl group; and "p" is 0 or 1.

Such a negative photosensitive resin composition is soluble in an alkaline aqueous solution, and enables formation of a fine pattern and high resolution.

Furthermore, the component (B) is preferably a crosslinking alkali-soluble polymer compound further containing one or both of a structural unit represented by the following general formula (6) and a structural unit represented by the following general formula (a),

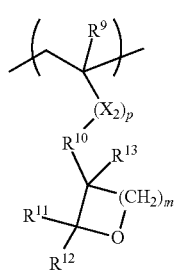
(6)

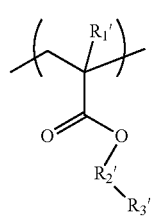
(α)

wherein R⁹ represents a hydrogen atom or a methyl group; each $X_2$ represents —C(=O)—O—, a phenylene group, or a naphthylene group; R¹⁰ represents a linear, branched, or cyclic alkylene group having 1 to 15 carbon atoms and optionally containing an ester group, an ether group, or an aromatic hydrocarbon group; R¹¹ represents a hydrogen atom, a linear, branched, or cyclic alkyl group having 1 to 6 carbon atoms, or is optionally bonded with R¹⁰ to form a ring; R¹² represents a hydrogen atom or a linear, branched, or cyclic alkyl group having 1 to 6 carbon atoms; R¹³ represents a hydrogen atom or a linear alkyl group having 1 to 6 carbon atoms, and is optionally bonded with R¹⁰ to form a ring; "m" is 0 or 1; "p" is 0 or 1; $R_1'$ represents a hydrogen atom or a methyl group; $R_2'$ represents a single bond or an alkylene group; and $R_3'$ represents a blocked isocyanate group.

Such an alkali-soluble polymer compound undergoes a crosslinking reaction with a phenolic hydroxy group of the component (A) alkali-soluble resin since a crosslinkable group excellent in crosslinking property is present. Therefore, excellent mechanical characteristics such as rupture elongation and tensile strength can be achieved even when cured at low temperatures, and heat resistance is also improved.

Furthermore, the component (B) is preferably a crosslinking alkali-soluble polymer compound further containing a structural unit represented by the following general formula (7),

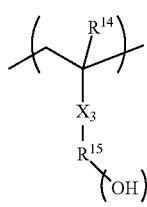

(7)

wherein R¹⁴ represents a hydrogen atom or a methyl group; R¹⁵ represents a single bond or a linear, branched, or cyclic aliphatic saturated hydrocarbon group with a valency of (l+1) having 1 to 13 carbon atoms, wherein a carbon atom of the aliphatic saturated hydrocarbon group is optionally substituted with an oxygen atom; each $X_3$ represents —C(=O)—O—, —C(=O)—O—R¹⁶—, —C(=O)—NH—, —C(=O)—N(R¹⁶OH)—, a phenylene group, or a naphthylene group; R¹⁶ represents a divalent linear, branched, or cyclic aliphatic saturated hydrocarbon group having 1 to 12 carbon atoms or an aromatic hydrocarbon group having 6 to 12 carbon atoms, wherein a carbon atom of the aliphatic saturated hydrocarbon group is optionally substituted with an oxygen atom; and "l" is 0 or 1.

Such a polymer compound reacts with the heat crosslinking agent (D) while maintaining alkali-solubility, so that a pattern with high resolution can be obtained.

Furthermore, the component (B) is preferably a crosslinking alkali-soluble polymer compound containing the structural units represented by the following general formula (3), the following general formula (5), one or both of the following general formula (6) and the following general formula (α), and the following general formula (7),

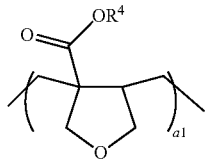

(3)

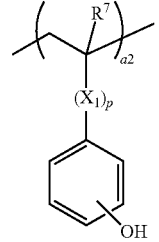

(5)

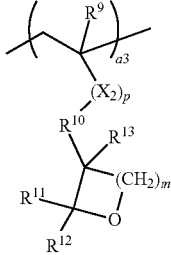

(6)

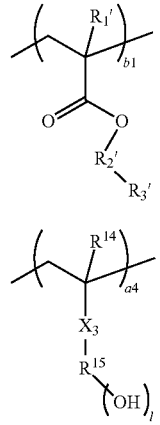

(α)

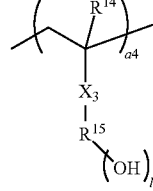

(7)

wherein R⁴ represents a hydrogen atom or a linear or branched alkyl group having 1 to 5 carbon atoms; R⁷ represents a hydrogen atom or a methyl group; each $X_1$ represents —C(=O)—O—, —C(=O)—O—R⁸—, —C(=O)—NH—, —C(=O)—NH—R⁸—, or —C(=O)—N(R⁸OH)—; R⁸ represents a divalent linear, branched, or cyclic aliphatic saturated hydrocarbon group having 1 to 12 carbon atoms or an aromatic hydrocarbon group having 6 to 12 carbon atoms, wherein a carbon atom of the aliphatic saturated hydrocarbon group is optionally substituted with an oxygen atom; a hydrogen atom of an aromatic hydrocarbon group in the formulae is optionally substituted with a methyl group; R⁹ represents a hydrogen atom or a methyl group; each $X_2$ represents —C(=O)—O—, a phenylene group, or a naphthylene group; R¹⁰ represents a linear, branched, or cyclic alkylene group having 1 to 15 carbon atoms and optionally containing an ester group, an ether group, or an aromatic hydrocarbon group; R¹¹ represents a hydrogen atom, a linear, branched, or cyclic alkyl group having 1 to 6 carbon atoms, or is optionally bonded with $R^{10}$ to form a ring; $R^{12}$ represents a hydrogen atom or a linear, branched, or cyclic alkyl group having 1 to 6 carbon atoms; $R^{13}$ represents a hydrogen atom or a linear alkyl group having 1 to 6 carbon atoms, and is optionally bonded with $R^{10}$ to form a ring; $R_1'$ represents a hydrogen atom or a methyl group; $R_2'$ represents a single bond or an alkylene group; $R_3'$ represents a blocked isocyanate group; $R^{14}$ represents a hydrogen atom or a methyl group; $R^{15}$ represents a single bond or a linear, branched, or cyclic aliphatic saturated hydrocarbon group with a valency of (l+1) having 1 to 13 carbon atoms, wherein a carbon atom of the aliphatic saturated hydrocarbon group is optionally substituted with an oxygen atom; each $X_3$ represents —C(=O)—O—, —C(=O)—O—$R^{16}$—, —C(=O)—NH—, —C(=O)—N($R^{16}$OH)—, a phenylene group, or a naphthylene group; $R^{16}$ represents a divalent linear, branched, or cyclic aliphatic saturated hydrocarbon group having 1 to 12 carbon atoms or an aromatic hydrocarbon group having 6 to 12 carbon atoms, wherein a carbon atom of the aliphatic saturated hydrocarbon group is optionally substituted with an oxygen atom; "p" is 0 or 1; "m" is 0 or 1; "l" is 0 or 1; 0<a1<1.0, 0<a2<1.0, 0≤a3<1.0, 0≤b1<1.0, 0<a3+b1<1.0, and 0<a4<1.0; and one of 0<a1+a2+a3+a4≤1.0, 0<a1+a2+b1+a4≤1.0, and 0<a1+a2+a3+b1+a4≤1.0 is satisfied.

Using such a crosslinkable polymer compound, a high-resolution pattern can be obtained while maintaining sufficient alkali-solubility. Moreover, since a ring structure is introduced to a main chain skeleton and there is also a crosslinkable group excellent in crosslinking property, mechanical characteristics such as rupture elongation and tensile strength are excellent even when cured at low temperatures.

Furthermore, the component (D) preferably contains one or more kinds of crosslinking agents selected from an amino condensate modified by formaldehyde or formaldehyde-alcohol; and a phenol compound having two or more methylol groups or alkoxymethylol groups by average in one molecule.

Such a component (D) allows suitable alkali-solubility of the photosensitive resin composition, and sufficient crosslinking reaction progresses at a PEB (Post Exposure Bake) temperature in lithography patterning, so that excellent lithography patterning becomes possible.

Furthermore, 10 to 100 parts by mass of the component (B) is preferably contained relative to 100 parts by mass of the component (A).

Within such a range, sufficient mechanical characteristics, in particular, elongation and tensile strength of the cured film can be achieved while maintaining lithography characteristics.

One or more of (E) a basic compound, (F) a thermal acid generator, (G) an antioxidant, and (H) a silane compound is preferably further comprised.

When the basic compound of the component (E) is contained, not only can dissolution contrast in lithography patterning be enhanced, the pattern shape can also be controlled. The thermal acid generator of the component (F) can further improve the mechanical strength, chemical resistance, adhesiveness and so forth of an obtained pattern or film by further advancing the crosslinking and curing reaction. Furthermore, the antioxidant of the component (G) can suppress degradation of physical properties due to degradation by oxidation of the cured film during a reliability test such as a high humidity test or a thermal shock test, and a more suitable cured film can be formed. The silane compound of the component (H) can further improve the adhesiveness of the obtained pattern or film to a substrate.

Furthermore, the present invention provides a patterning process comprising:

(1) forming a photosensitive material film by coating a substrate with the above-described negative photosensitive resin composition;

(2) subsequently, after a heat treatment, exposing the photosensitive material film with a high-energy beam having a wavelength of 190 to 500 nm or an electron beam via a photomask; and (3) after irradiation, developing the substrate, which has been heat-treated, with a developer of an alkaline aqueous solution.

According to such a patterning process, since the negative photosensitive resin composition used is soluble in an alkaline aqueous solution, a fine pattern can be formed and high resolution can be achieved.

Furthermore, the present invention provides a method for forming a cured film comprising:

heating and post-curing a film on which a pattern is formed by the above-described patterning process at a temperature of 100 to 300° C.

According to such a method for forming a cured film, a cured film (pattern) excellent in mechanical characteristics can be formed even when cured at low temperatures.

Furthermore, the present invention provides an interlayer insulation film being a cured film by curing the above-described negative photosensitive resin composition.

Furthermore, the present invention provides a surface protective film being a cured film by curing the above-described negative photosensitive resin composition.

The cured film obtained by curing the inventive negative photosensitive resin composition has excellent adhesiveness with a substrate, heat resistance, electric characteristics, mechanical strength, and chemical resistance to alkaline release liquid or the like, and a semiconductor device having the cured film as a protective coating has excellent reliability. Therefore, the cured film is suitable as a protective coating (an interlayer insulation film or surface protective film) of electric and electronic components, semiconductor devices, and the like.

Furthermore, the present invention provides an electronic component having the above-described interlayer insulation film or the above-described surface protective film.

Such a protective coating (interlayer insulation film or surface protective film) is effective for an insulation film for semiconductor devices including rewiring use, an insulation film for multilayer printed boards and so on from the viewpoint of heat resistance, chemical resistance, and insulation property, and can give electronic components having excellent reliability.

Advantageous Effects of Invention

As described above, according to the present invention, it is possible to provide a negative photosensitive resin composition that is soluble in an alkaline aqueous solution, makes it possible to form a fine pattern and achieve high resolution, and has excellent mechanical characteristics of high elongation and high strength and excellent adhesiveness even when cured in a wide temperature range of a low temperature range.

BRIEF DESCRIPTION OF DRAWINGS

FIG. 1 is an explanatory diagram illustrating an adhesion measurement method.

DESCRIPTION OF EMBODIMENTS

As described above, there has been demand for a photosensitive resin composition that is soluble in an alkaline aqueous solution, makes it possible to form a fine pattern and achieve high resolution, and has excellent mechanical characteristics even when cured at low temperatures.

To achieve the object, the present inventors have earnestly studied and found out that a pattern obtained by using a negative photosensitive resin composition containing: (A) an alkali-soluble resin containing at least one structure selected from a polyimide structure, a polyamide structure, a polybenzoxazole structure, a polyamide-imide structure, and a precursor structure thereof; (B) a polymer compound having a structural unit formed by cyclopolymerization; (C) a compound that generates an acid by light; and (D) a heat crosslinking agent is capable of forming a fine pattern, and that the mechanical characteristics of the obtained cured film are excellent.

Furthermore, the present inventors have found out that a protective film obtained by using the above-described negative photosensitive resin composition by forming a pattern and heating has excellent adhesion after a high temperature and high humidity test. That is, the present inventors have found out that a cured film with a pattern formed by using the negative photosensitive resin composition is excellent as an electric and electronic component protective film and an insulation protective film, and thus completed the present invention. In the present specification, the electric and electronic components are also summarized as "electronic component".

That is, the present invention is a negative photosensitive resin composition containing:
(A) an alkali-soluble resin containing at least one structure selected from a polyimide structure, a polyamide structure, a polybenzoxazole structure, a polyamide-imide structure, and a precursor structure thereof;
(B) a polymer compound having a structural unit formed by cyclopolymerization;
(C) a compound that generates an acid by light; and
(D) a heat crosslinking agent.

Hereinafter, the present invention will be described in detail, but the present invention is not limited thereto.

[Negative Photosensitive Resin Composition]

The negative photosensitive resin composition of the present invention will be described.

The inventive negative photosensitive resin composition contains:
(A) an alkali-soluble resin containing at least one structure selected from a polyimide structure, a polyamide structure, a polybenzoxazole structure, a polyamide-imide structure, and a precursor structure thereof; (B) a polymer compound having a structural unit formed by cyclopolymerization; (C) a compound that generates an acid by light; and (D) a heat crosslinking agent. The negative photosensitive resin composition can be alkali-developed. Furthermore, the negative photosensitive resin composition may further contain, as needs arise, (E) a basic compound, (F) a thermal acid generator, (G) an antioxidant, (H) a silane compound, and the like, besides the component (A), component (B), component (C), and component (D). Hereinafter, these components will be described in detail.

[(A) Alkali-Soluble Resin]

The alkali-soluble resin (A) to be used in the present invention contains at least one structure selected from a polyimide structure, a polyamide structure, a polybenzoxazole structure, a polyamide-imide structure, and a precursor structure thereof. The resin (A) is not particularly limited as long as the resin (A) is an alkali-soluble resin containing a structure mentioned above, but a resin containing the structure represented by the following general formula (8) and/or (9) is preferable.

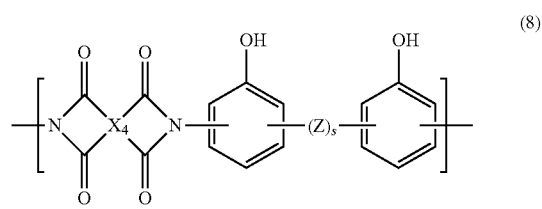

(8)

In the formula, $X_4$ represents a tetravalent organic group, "s" represents 0 or 1, Z represents a divalent linking group, and when s=0, two aromatic rings in the formula are directly bonded without a linking group.

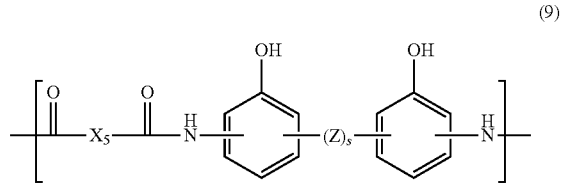

(9)

In the formula, $X_5$ represents a divalent organic group, and "s" and Z are the same as those described above.

$X_4$ in the general formula (8) represents a tetravalent organic group, but is not limited as long as it is a tetravalent organic group. $X_4$ is preferably a tetravalent organic group of an alicyclic aliphatic group having 4 to 40 carbon atoms or an aromatic group, and more preferably, a tetravalent organic group represented by the following formula (10). Furthermore, a structure of $X_4$ may be one kind or a combination of two or more kinds.

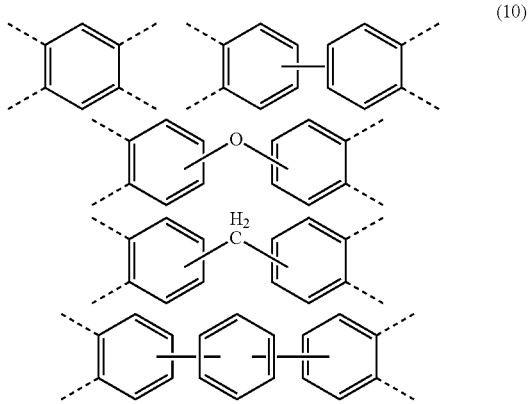

(10)

-continued

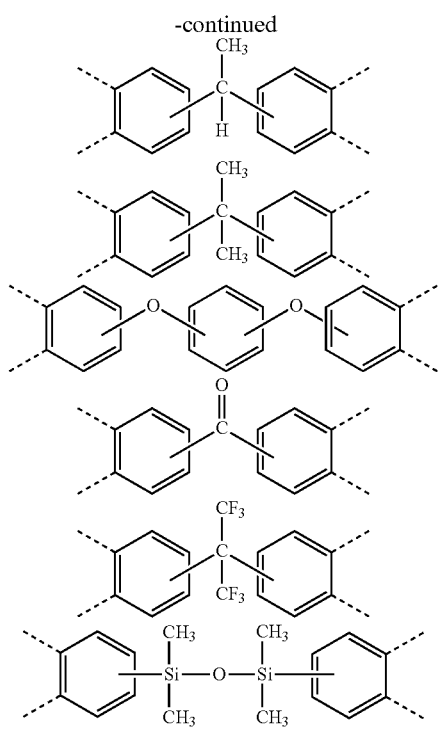

In the formulae, a dotted line represents a bond.

The "s" in the general formula (8) represents 0 or 1, and when "s" is 0, two aromatic rings in the general formula (8) are bonded directly without the divalent linking group Z.

Meanwhile, when "s" is 1, two aromatic rings in the general formula (8) are bonded via the divalent linking group Z. Z is not limited as long as it is a divalent group. Preferably, Z is a divalent organic group of an alicyclic aliphatic group having 4 to 40 carbon atoms or an aromatic group, and more preferably a divalent linking group represented by the following formula (11). The structure of Z may be one kind or a combination of two or more kinds.

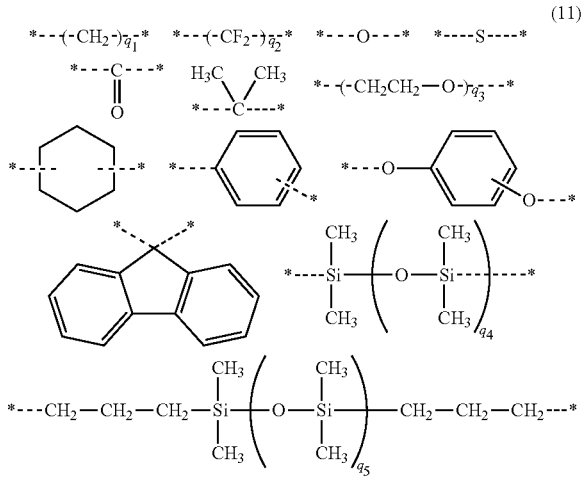

In the formulae, $q_1$, $q_2$, and $q_3$ represent an integer of 1 to 6, and $q_4$ and $q_5$ represent an integer of 1 to 10. A dotted line represents a bond.

In particular, a preferable divalent linking group Z is a divalent group represented by the following formula (12) or (13).

In the formulae, a dotted line represents a bond.

As a structural unit represented by the general formula (8), when Z in the general formula (8) is a group represented by the formula (12), a structural unit represented by the following general formula (8-1) is preferable, and when Z in the general formula (8) is a group represented by the formula (13), a structural unit represented by the following general formula (8-2) is preferable.

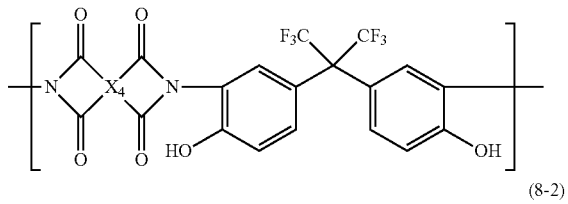

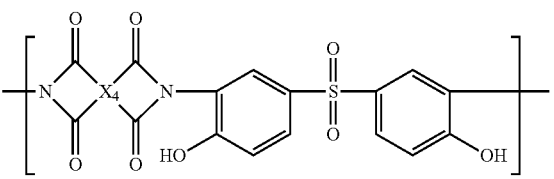

In the formulae, $X_4$ is the same as that described above.

As shown by the general formula (8-1), when the divalent linking group Z is a hexafluoropropylene group shown by the formula (12) and is located at a p-position of a phenolic hydroxy group, the acidity of the phenolic hydroxy group becomes high since the hexafluoropropylene group is an electron-withdrawing group. Thus, the solubility of an alkaline aqueous solution to a developer increases. Therefore, it is preferred that the Z be the group shown by the formula (12).

Similarly, as shown by the general formula (8-2), when the divalent linking group Z is a sulfonic group represented by the formula (13) and is located at a p-position of a phenolic hydroxy group, the acidity of the phenolic hydroxy group becomes high since the sulfonic group is also an electron-withdrawing group. Thus, the solubility of an alkaline aqueous solution to a developer increases. Therefore, it is also preferred that the Z be the group shown by the formula (13).

The $X_5$ in the general formula (9) is a divalent organic group, and is not limited as long as it is a divalent organic group. Preferably, $X_5$ is a divalent organic group of an aliphatic chain length structure or an alicyclic aliphatic group having 4 to 40 carbon atoms, or an aromatic group. Further preferably, $X_5$ is a divalent organic group represented by the following formula (14). The structure of $X_5$ may be one kind or a combination of two or more kinds.

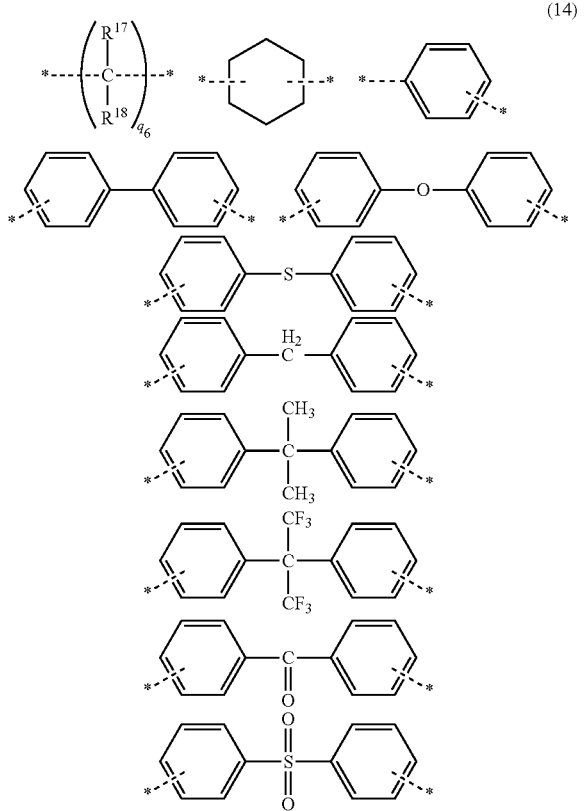
(14)

In the formulae, $R^{17}$ and $R^{18}$ each independently represent a hydrogen atom, a fluorine atom, or an alkyl group having 1 to 6 carbon atoms, $q_6$ is an integer of 1 to 30, and a dotted line represents a bond.

When the $X_5$ in the general formula (9) is a divalent organic group that is an aliphatic chain length structure, the mechanical strength, in particular, the elongation of a cured film of the inventive negative photosensitive resin composition is improved. Therefore, this case is preferred.

The "s" and Z in the general formula (9) are the same as above, and Z is preferably the formula (12) or (13) from the viewpoint of the solubility to a developer of an alkaline aqueous solution. Also in this case, in the same manner as the case of the general formulae (8-1) and (8-2), the acidity of the phenolic hydroxy group becomes higher, and the solubility to the developer that is an alkaline aqueous solution is improved. Therefore, this case is preferred.

The alkali-soluble resin (A) to be used in the present invention may further contain a structural unit represented by the following general formula (15) (hereinafter, also referred to as a structural unit (15)) in addition to the structural units shown by the general formulae (8) and (9).

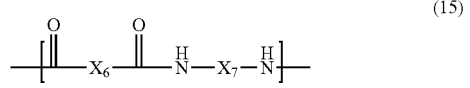
(15)

In the formula, $X_6$ is the same as $X_5$. $X_7$ is a divalent organic group.

The $X_7$ in the general formula (15) is a divalent organic group, and is not restricted as long as it is a divalent organic group. However, $X_7$ is preferably a divalent organic group having 6 to 40 carbon atoms, more preferably a cyclic organic group having an aromatic ring having a substituent or a cyclic organic group containing 1 to 4 aliphatic rings, or an aliphatic group or a siloxane group not having a cyclic structure. Further suitable examples of $X_7$ include structures shown by the following formulae (16) or the following general formulae (17). The structure of $X_7$ may be one kind or a combination of two or more kinds.

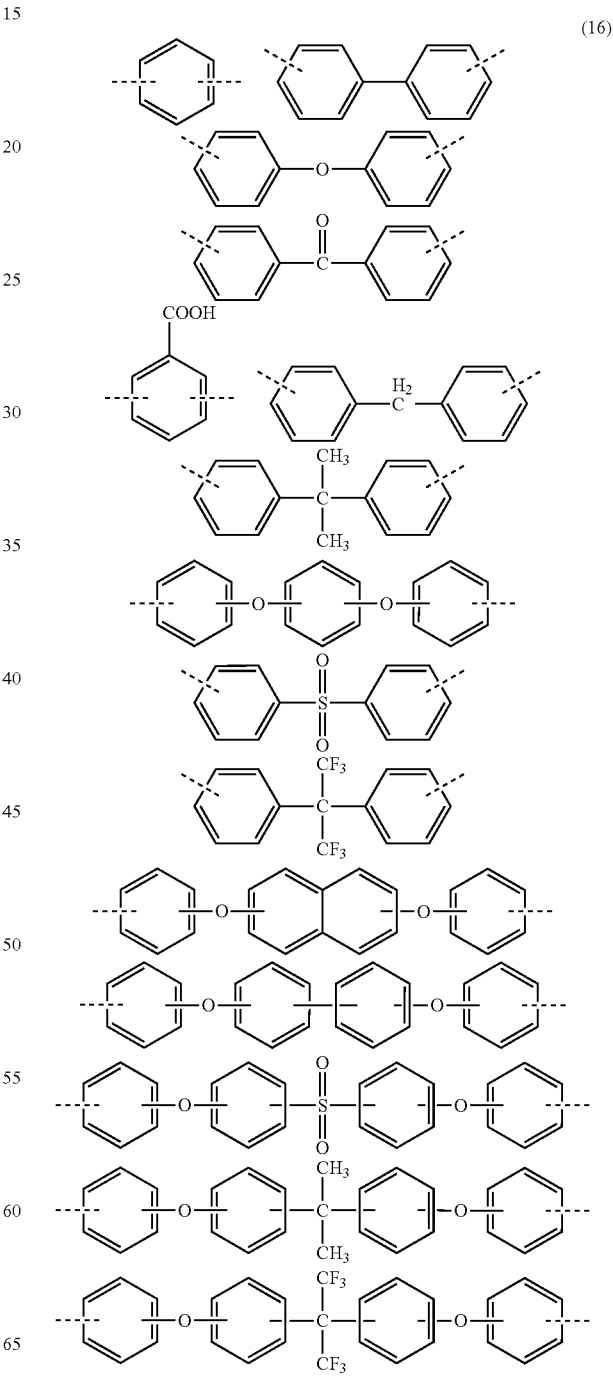
(16)

-continued

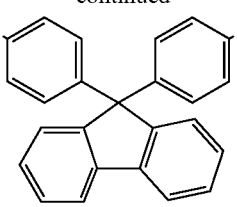

In the formulae, a dotted line represents a bond with an amino group.

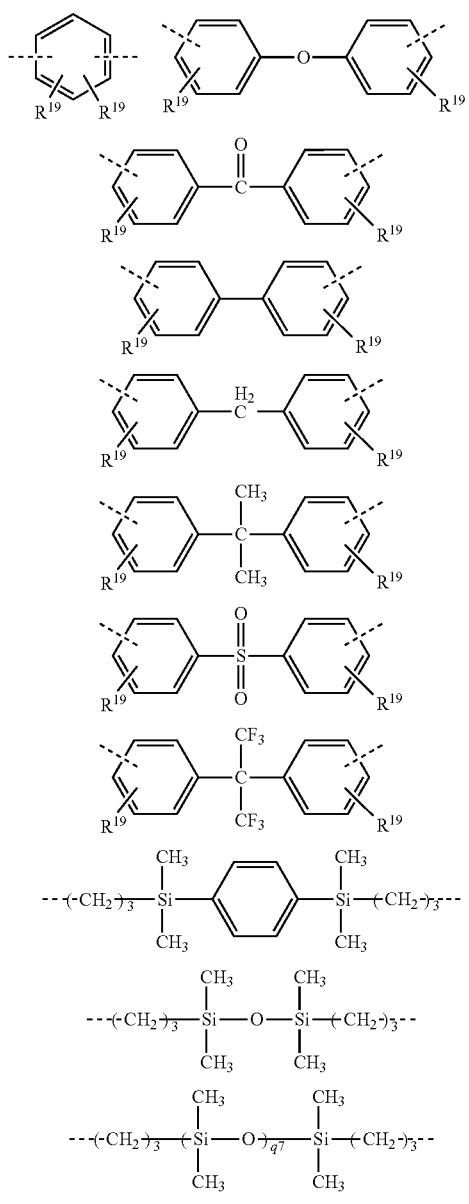

(17)

-continued

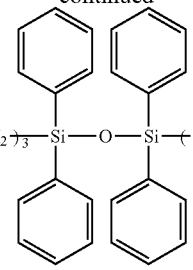

In the formulae, a dotted line represents a bond with an amino group, $R^{19}$ each independently represents a methyl group, an ethyl group, a propyl group, an n-butyl group, or a trifluoromethyl group, and $q_7$ represents an integer of 2 to 20.

The alkali-soluble resin (A) to be used in the present invention preferably further contains a structural unit represented by the following general formula (18) (hereinafter, also referred to as a structural unit (18)) in addition to the structural units represented by the general formulae (8) and (9).

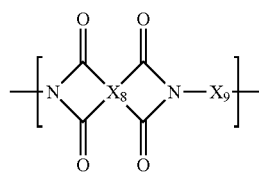

(18)

In the formula, $X_8$ is a tetravalent organic group that is the same as or different from the $X_4$, and $X_9$ is a group represented by the following general formula (19).

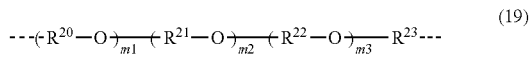

(19)

In the formula, $R^{20}$ to $R^{23}$ each independently represent a linear or branched alkylene group having 2 to 10 carbon atoms, $m_1$ is an integer of 1 to 40, and $m_2$ and $m_3$ each independently represent an integer of 0 to 40.

$X_8$ in the general formula (18) may be a tetravalent organic group cited as $X_4$, for example, a tetravalent organic group shown by the formula (10). Meanwhile, in $X_9$ (the group represented by the general formula (19)), specific examples of a preferred organic group include the following. However, there is no restriction to these.

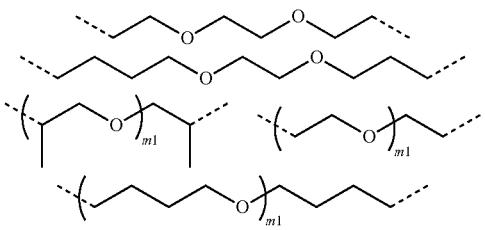

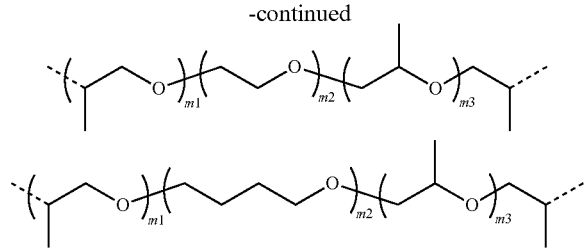

When the alkali-soluble resin (A) contains such a structural unit (19), flexibility is produced to obtain a cured film having high elongation and low warpage.

Furthermore, the alkali-soluble resin (A) to be used in the present invention can also contain a structural unit represented by the following general formula (20) or (21) (hereinafter, structural unit (20), structural unit (21)).

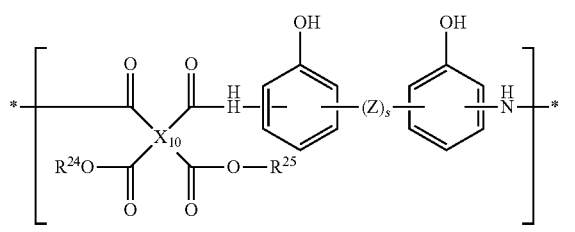

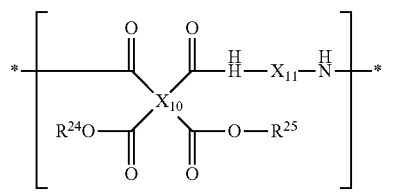

In the formulae, $X_{10}$ is a tetravalent organic group that is the same as or different from the $X_4$, $X_{11}$ is a divalent organic group that is the same as or different from $X_7$, and "s" and Z are the same as above. $R^{24}$ and $R^{25}$ are each independently a hydrogen atom, a linear, branched, or cyclic alkyl group having 1 to 6 carbon atoms, or an organic group represented by the following general formula (22), where at least one of $R^{24}$ and $R^{25}$ is an organic group represented by the following general formula (22).

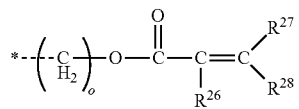

In the formula, a dotted line represents a bond. $R^{26}$ is a hydrogen atom or an organic group having 1 to 3 carbon atoms, $R^{27}$ and $R^{28}$ are each independently a hydrogen atom or an organic group having 1 to 3 carbon atoms, and "o" is an integer of 2 to 10.

The $X_{10}$ in the structural units (20) and (21) is a tetravalent organic group and can be the same as or different from the above-described $X_4$, and is not limited as long as it is a tetravalent organic group. $X_{10}$ is preferably a tetravalent organic group of an alicyclic aliphatic group having 4 to 40 carbon atoms or an aromatic group, further preferably a tetravalent organic group represented by the formula (10). The structure of $X_{10}$ may be one kind or a combination of two or more kinds.

Meanwhile, the $X_{11}$ in the structural unit (21) is a divalent organic group and can be the same as or different from the above-described $X_7$, and is not limited as long as it is a divalent organic group. $X_{11}$ is preferably a divalent organic group having 6 to 40 carbon atoms, more preferably a cyclic organic group having an aromatic ring having a substituent or a cyclic organic group containing 1 to 4 aliphatic rings, or an aliphatic group or a siloxane group not having a cyclic structure. Further suitable examples of $X_{11}$ include structures shown by the formulae (16) or the general formulae (17). The structure of $X_{11}$ may be one kind or a combination of two or more kinds.

The $R^{24}$ and $R^{25}$ in the structures (20) and (21) are each independently a hydrogen atom or a linear, branched, or cyclic alkyl group having 1 to 6 carbon atoms, or an organic group represented by the general formula (22), and at least one of $R^{24}$ and $R^{25}$ is an organic group represented by the general formula (22).

The $R^{26}$ in the general formula (22) is not limited as long as it is a hydrogen atom or a monovalent organic group having 1 to 3 carbon atoms. However, from the viewpoint of photosensitive characteristics of the negative photosensitive resin composition, a hydrogen atom or a methyl group is preferable.

The $R^{27}$ and $R^{28}$ in the general formula (22) are not limited as long as they are each independently a hydrogen atom or a monovalent organic group having 1 to 3 carbon atoms. However, from the viewpoint of photosensitive characteristics of the negative photosensitive resin composition, a hydrogen atom is preferable.

The "o" in the general formula (22) is an integer of 2 to 10, and from the viewpoint of photosensitive characteristics, is preferably an integer of 2 to 4. Further preferably, "o" is 2.

[(B) Polymer Compound Having Structural Unit Formed by Cyclopolymerization]

The polymer compound (B) to be used in the present invention is not particularly limited as long as it has a structural unit formed by cyclopolymerization.

Preferably used examples of monomers for obtaining a structural unit formed by cyclopolymerization include diallyl quaternary ammonium salts, ether perfluoro-1,6-diene, and α-(allyloxymethyl) acrylic acid esters.

Furthermore, to improve adhesiveness to a substrate, the structural unit formed by cyclopolymerization in the component (B) is more preferably at least one structural unit represented by the following general formula (1), the following general formula (2), the following general formula (3), and the following general formula (4).

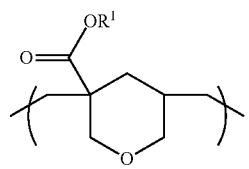

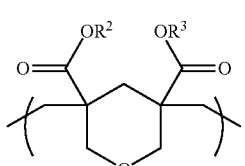

(2)

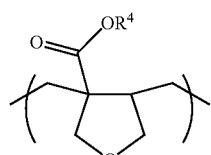

(3)

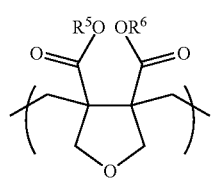

(4)

In the formulae, $R^1$, $R^2$, $R^3$, $R^4$, $R^5$, and $R^6$ each independently represent a hydrogen atom or a linear or branched alkyl group having 1 to 5 carbon atoms.

As a monomer unit for forming the structural unit formed by cyclopolymerization, the monomer units given in the following general formulae (23) and (24) are particularly preferable. One of these monomers may be used, or two or more thereof may be used.

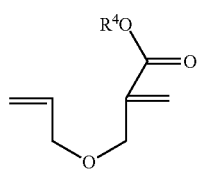

(23)

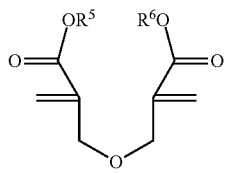

(24)

In the formulae, $R^4$, $R^5$, and $R^6$ are as described above.

In particular, specific examples of commercially available monomers that can be used include ACRYCURE RD series and ACRYCURE RE series (trade names, manufactured by NIPPON SHOKUBAI CO., LTD.).

In particular, from viewpoints of polymerization property and stability, the structural unit of the general formula (3) and the monomer unit (23) are more preferable.

Furthermore, in order to provide alkali-solubility and improve crosslinking density, the polymer compound of the component (B) more preferably contains a structural unit represented by the following general formula (5) or (5').

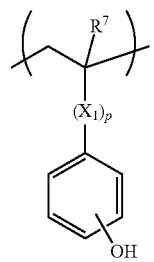

(5)

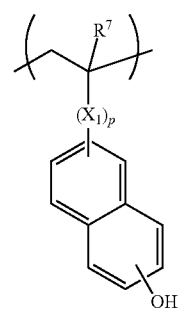

(5')

In the formulae, $R^7$ represents a hydrogen atom or a methyl group; each $X_1$ represents —C(=O)—O—, —C(=O)—O—$R^8$—, —C(=O)—NH—, —C(=O)—NH—$R^8$—, or —C(=O)—N($R^8$OH)—; and $R^8$ represents a divalent linear, branched, or cyclic aliphatic saturated hydrocarbon group having 1 to 12 carbon atoms or an aromatic hydrocarbon group having 6 to 12 carbon atoms, where a carbon atom of the aliphatic saturated hydrocarbon group is optionally substituted with an oxygen atom. A hydrogen atom of an aromatic hydrocarbon group in the formulae is optionally substituted with a methyl group. "p" is 0 or 1.

Meanwhile, the structure represented by the general formula (5) preferably has an ester group or an amide group, which are electron-withdrawing groups, on a p-position of a phenolic hydroxy group. In this case, the acidity of the phenolic hydroxy group becomes high, and solubility to a developer of an alkaline aqueous solution becomes improved. Specific examples of monomers that can be favorably used for forming the structural units of the general formulae (5) and (5') include the following. However, examples are not limited thereto.

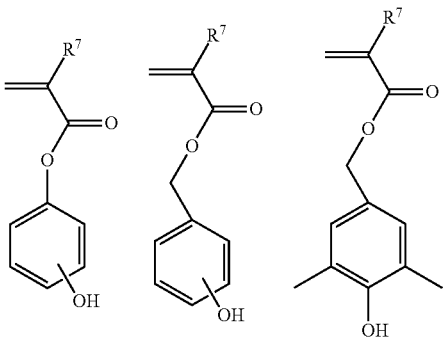

-continued

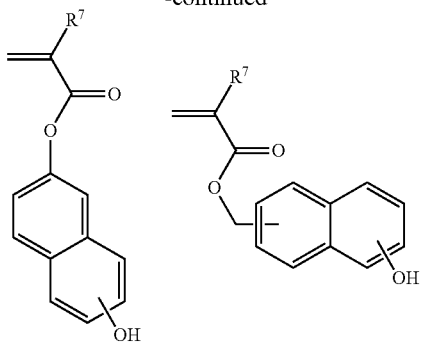

In the formulae, R⁷ is as described above.

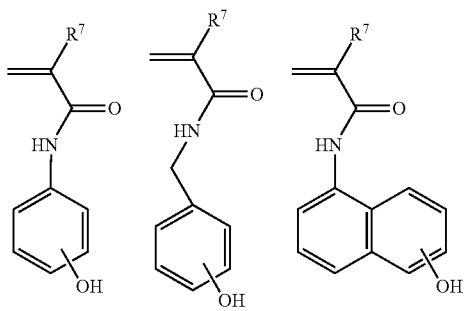

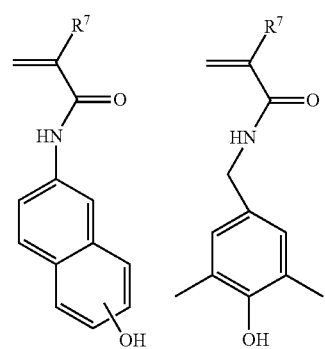

In the formulae, R⁷ is as described above.

The structures shown by the general formulae (5) and (5') are effective as units for promoting crosslinking in addition to alkali-solubility, and mechanical characteristics of the cured film can be further improved by using together with a structural unit formed by cyclopolymerization.

Furthermore, to improve crosslinking density, a monomer having an epoxy group or an oxetanyl group shown by the following general formula (6) or a monomer having a blocked isocyanate group shown by the following general formula (α) is preferably copolymerized with the polymer compound of the component (B).

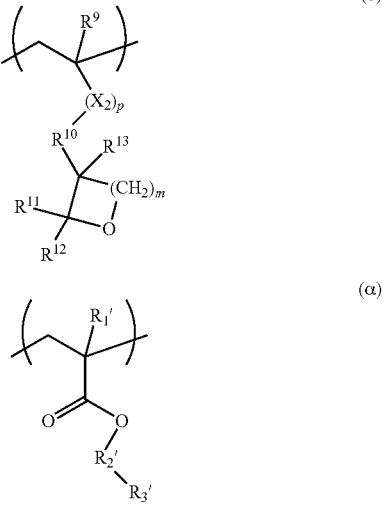

In the formula, $R^9$ represents a hydrogen atom or a methyl group; and each $X_2$ represents —C(=O)—O—, a phenylene group, or a naphthylene group. $R^{10}$ represents a linear, branched, or cyclic alkylene group having 1 to 15 carbon atoms and optionally containing an ester group, an ether group, or an aromatic hydrocarbon group; and $R^{11}$ represents a hydrogen atom, a linear, branched, or cyclic alkyl group having 1 to 6 carbon atoms, or is optionally bonded with $R^{10}$ to form a ring. $R^{12}$ represents a hydrogen atom or a linear, branched, or cyclic alkyl group having 1 to 6 carbon atoms; $R^{13}$ represents a hydrogen atom or a linear alkyl group having 1 to 6 carbon atoms, and is optionally bonded with $R^{10}$ to form a ring; "m" is 0 or 1; and "p" is 0 or 1. $R_1'$ represents a hydrogen atom or a methyl group; $R_2'$ represents a single bond or an alkylene group; and $R_3'$ represents a blocked isocyanate group.

Examples of monomers for forming the structural unit of the general formula (6) include the following.

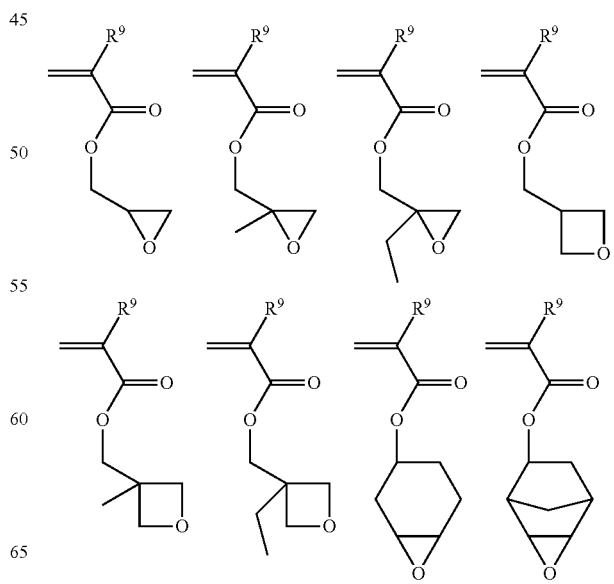

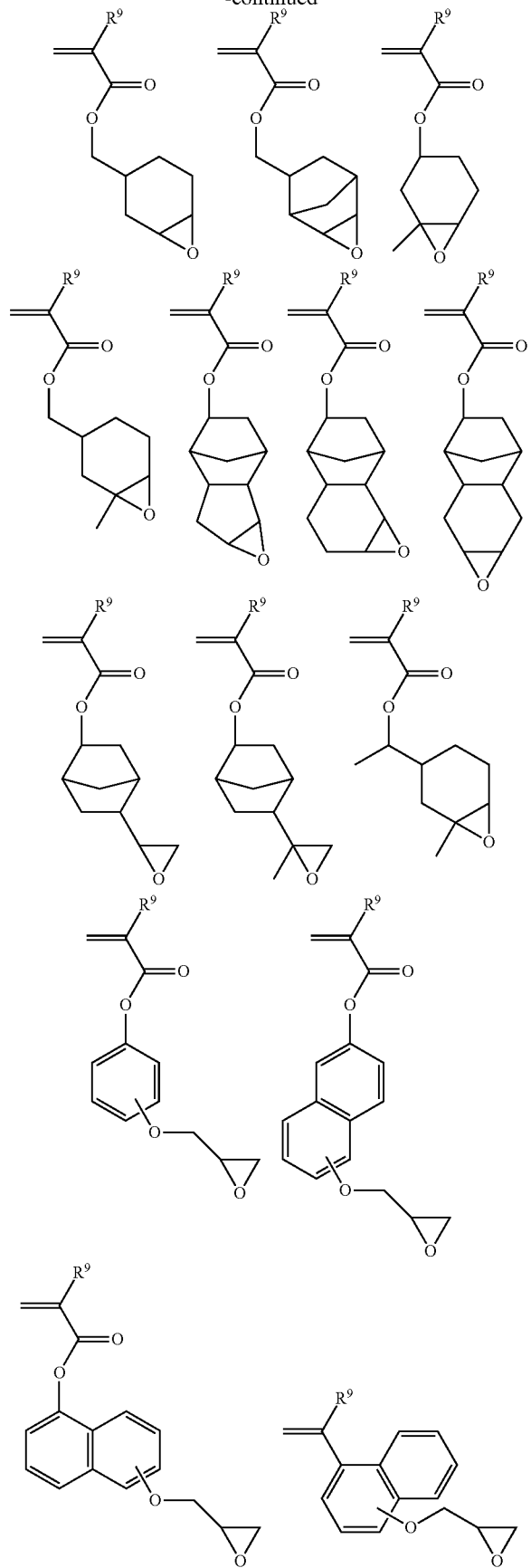
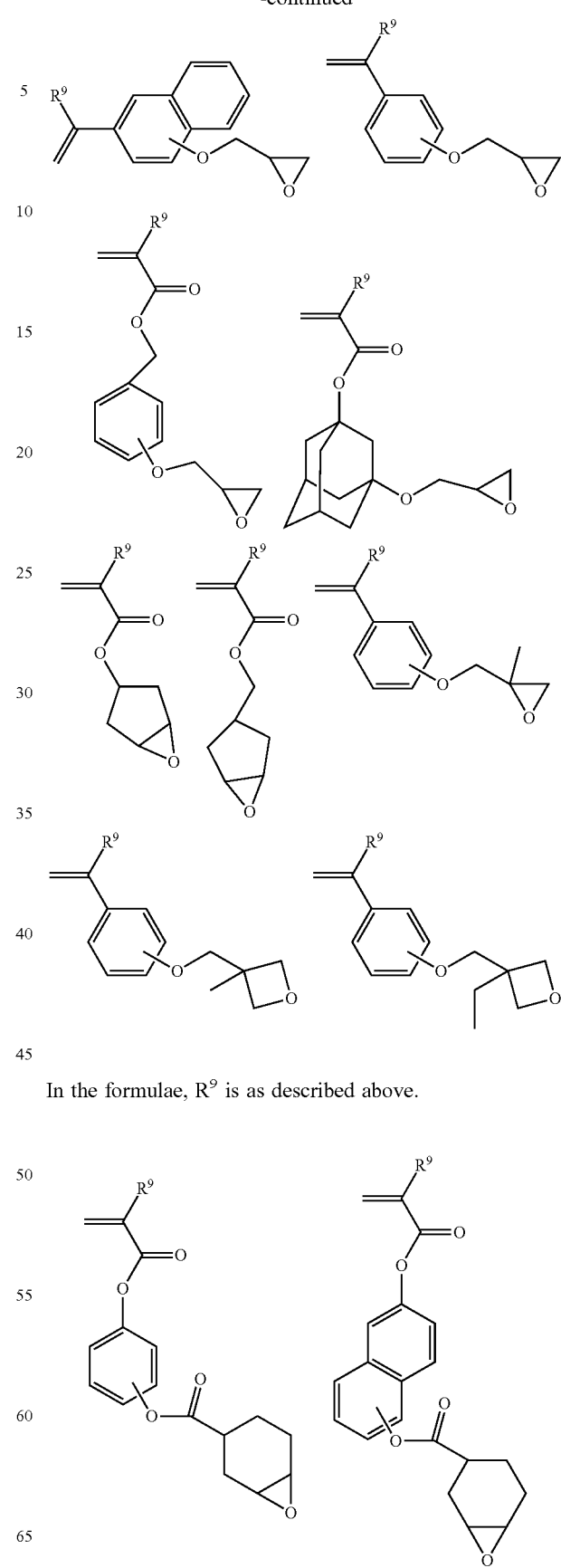
In the formulae, $R^9$ is as described above.

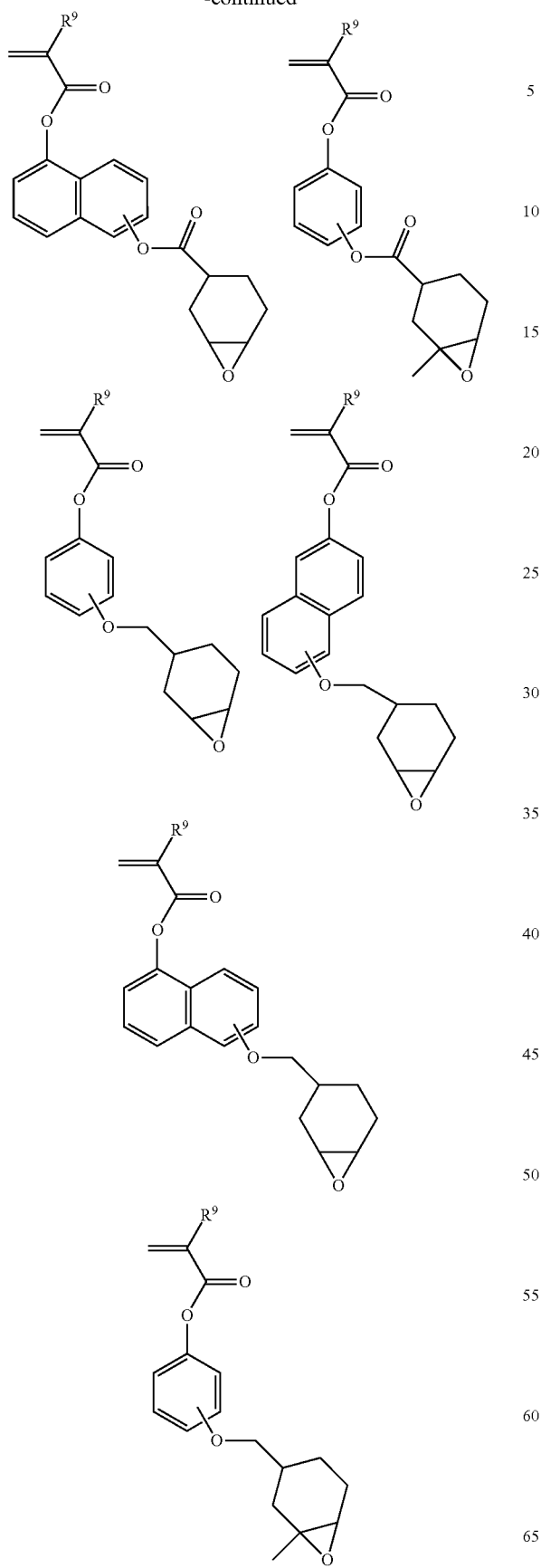
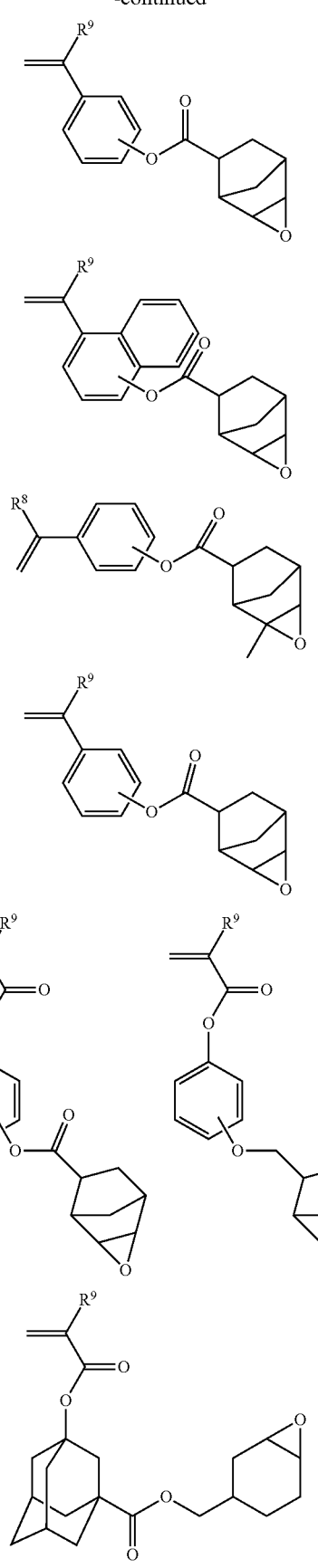

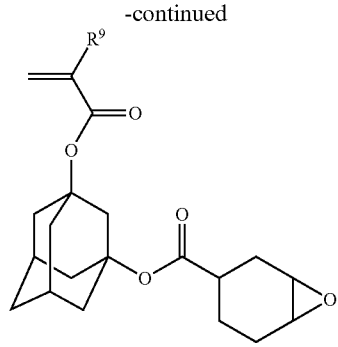
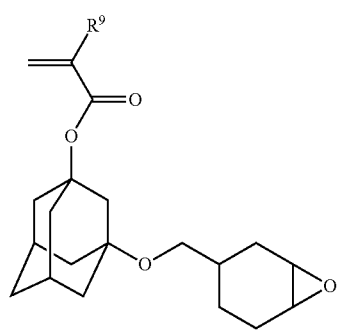
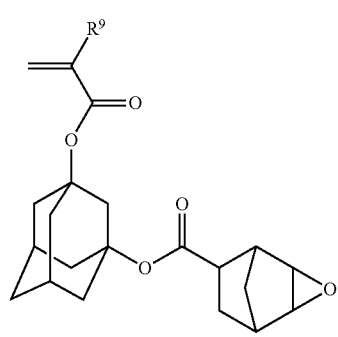
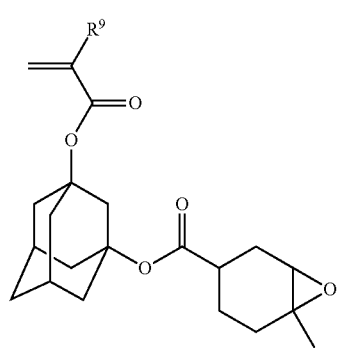
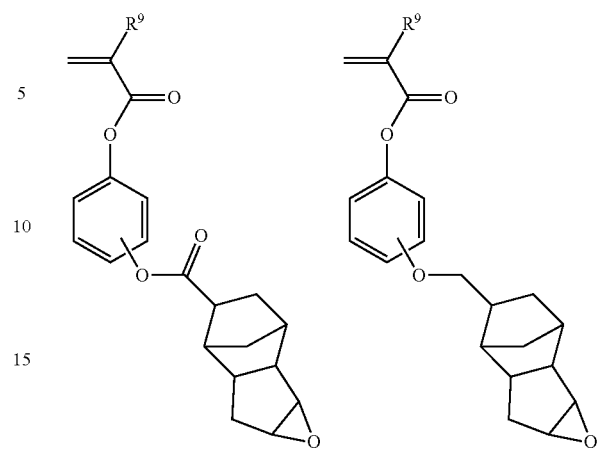
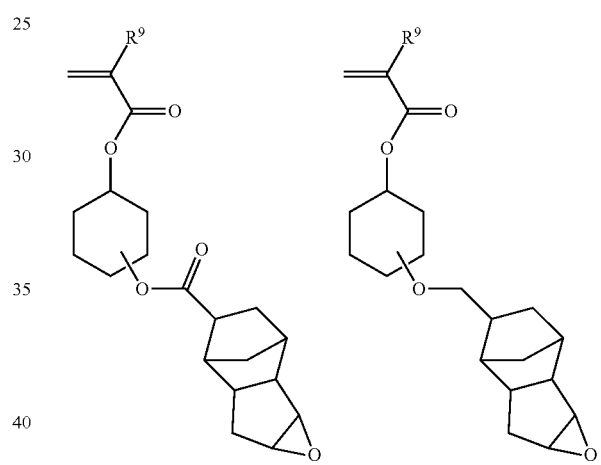
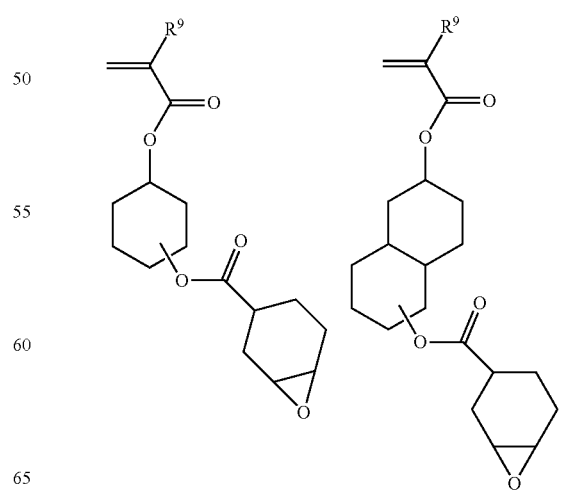
In the formulae, $R^9$ is as described above.

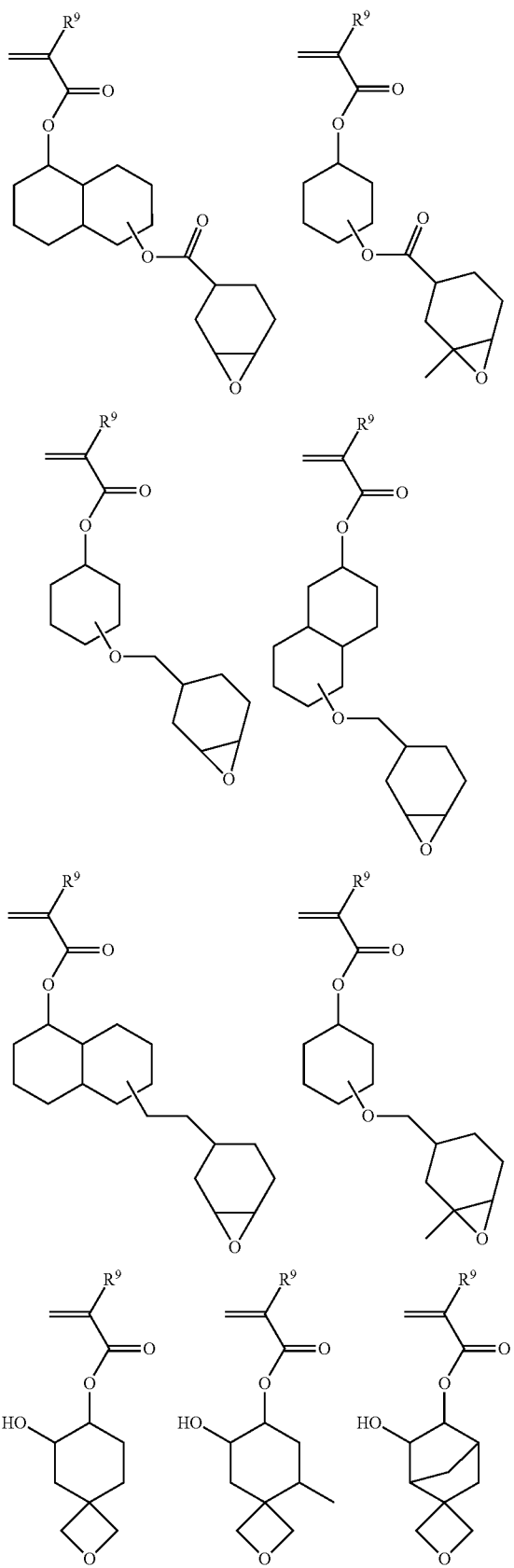
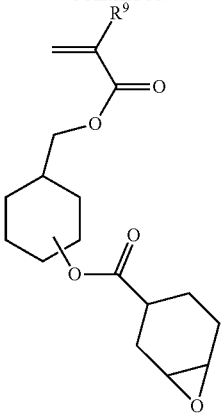

In the formulae, R⁹ is as described above.

Incidentally, some of the monomers for obtaining a repeating unit having an epoxy group and an oxetanyl group are disclosed in JP 2003-55362 A, JP 2005-8847 A, and JP 2005-18012 A.

In the general formula (α), $R_1'$ represents a hydrogen atom or a methyl group, $R_2'$ represents a single bond or an alkylene group, and $R_3'$ is a blocked isocyanate group.

The blocked isocyanate group is an organic group having an isocyanate group (—N=C=O) blocked with a suitable protecting group. A blocked isocyanate group can be formed by making an isocyanate group and a blocking agent react.

A blocked isocyanate group is stable at a normal temperature, but at a certain temperature or higher, the blocking agent is eliminated (deblocked), and the hydroxy group or the carboxy group in the component (A) reacts with the isocyanate group to form a crosslinking structure. Examples of the blocking agent include an active-hydrogen-containing compound that can react with isocyanate, for example, alcohol, phenol, polycyclic phenol, amide, imide, imine, thiol, oxime, lactam, active-hydrogen-containing heterocycle, and active-methylene-containing compound.

Suitable blocked isocyanate groups are disclosed in paragraphs [0015] to [0025] of JP 6601628 B, and those compounds can be used.

In particular, the monomer units shown below are more preferable since these have excellent polymerization property and can be used commercially. In addition, one of these monomers or two or more thereof may be used.

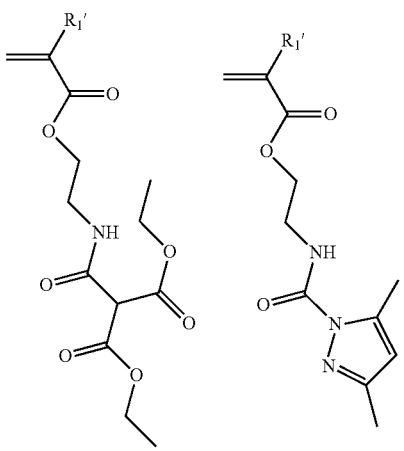

-continued

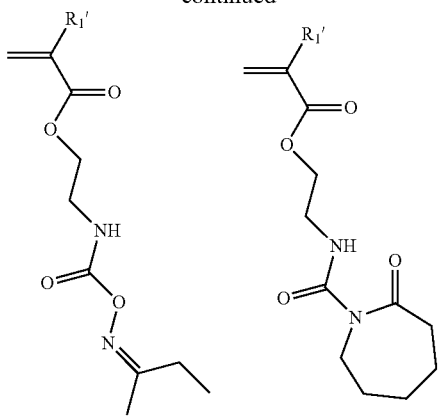

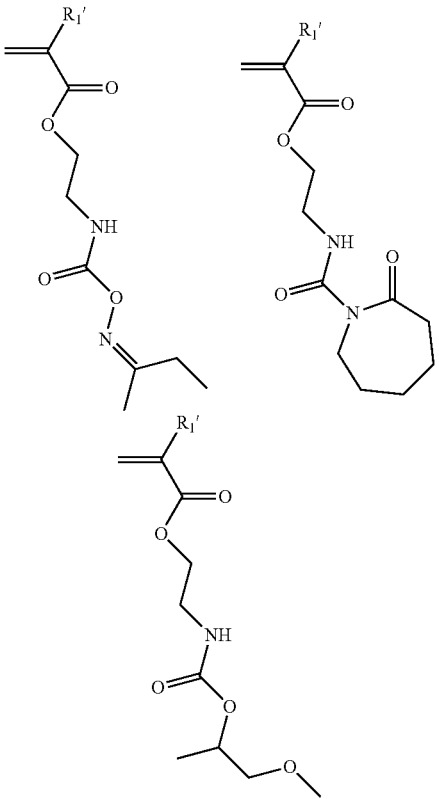

In the formulae, $R_1'$ is as described above.

In particular, specific examples that are commercially available include Karenz MOI Series and AOI Series (trade names, manufactured by Showa Denko K.K.).

In addition, from viewpoints of further improving cross-linking reactivity at the time of lithography patterning and improving the dissolution contrast of the unexposed/exposed part to an alkali developer, the structural unit of the following general formula (7) is preferably copolymerized with the polymer compound of the component (B).

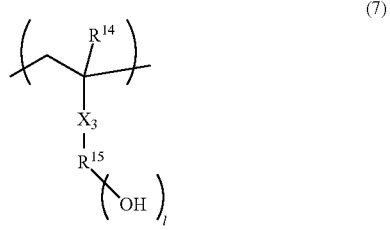

(7)

In the formulae, RC is as described above.

Furthermore, the monomer is preferably not deblocked in a heat treatment after spin-coating of the photosensitive composition (pre-bake) or a heat treatment after exposure (post-exposure bake (PEB)), is deblocked in the post-curing by a heat treatment after development, and undergoes a crosslinking reaction with an alkali-soluble resin.

Therefore, the monomer units shown below, which are deblocked within the range of 140° C. to 200° C., are more preferable.

In the formula, $R^{14}$ represents a hydrogen atom or a methyl group; and $R^{15}$ represents a single bond or a linear, branched, or cyclic aliphatic saturated hydrocarbon group with a valency of (l+1) having 1 to 13 carbon atoms, where a carbon atom of the aliphatic saturated hydrocarbon group is optionally substituted with an oxygen atom. Each $X_3$ represents —C(=O)—O—, —C(=O)—O—$R^{16}$—, —C(=O)—NH—, —C(=O)—N($R^{16}$OH)—, a phenylene group, or a naphthylene group. $R^{16}$ represents a divalent linear, branched, or cyclic aliphatic saturated hydrocarbon group having 1 to 12 carbon atoms or an aromatic hydrocarbon group having 6 to 12 carbon atoms, where a carbon atom of the aliphatic saturated hydrocarbon group is optionally substituted with an oxygen atom; and "l" is 0 or 1.
Examples of monomers for forming the structural unit of the general formula (7) include the following.
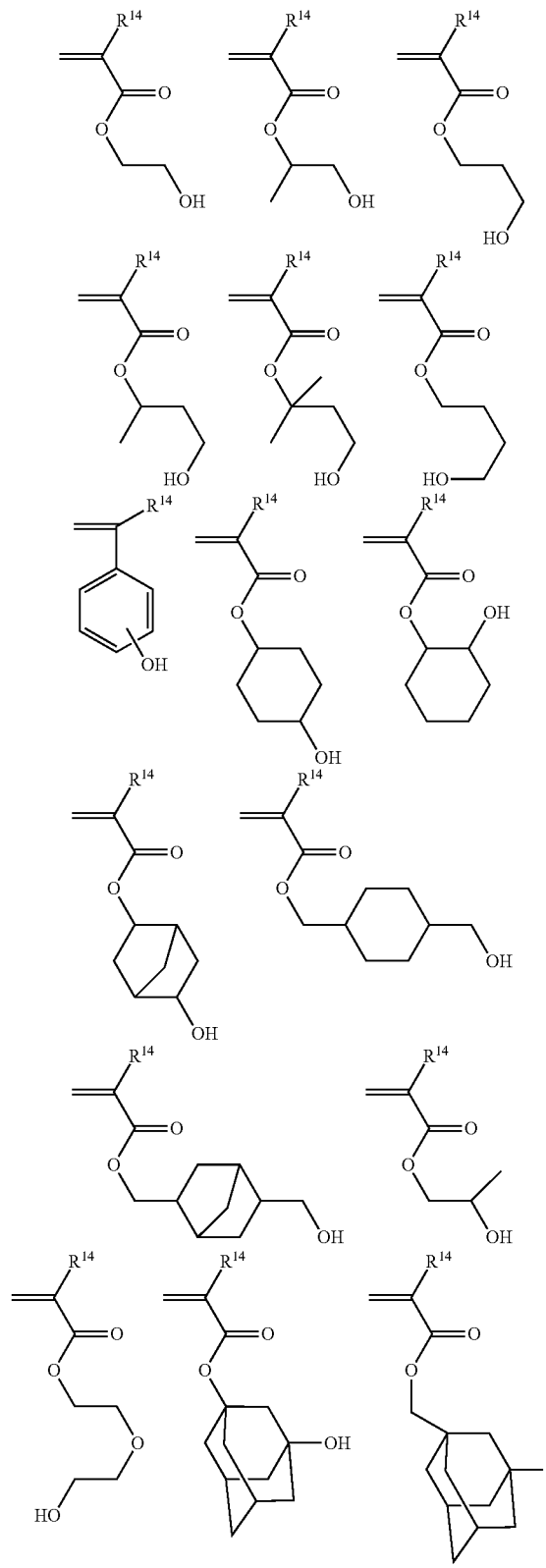
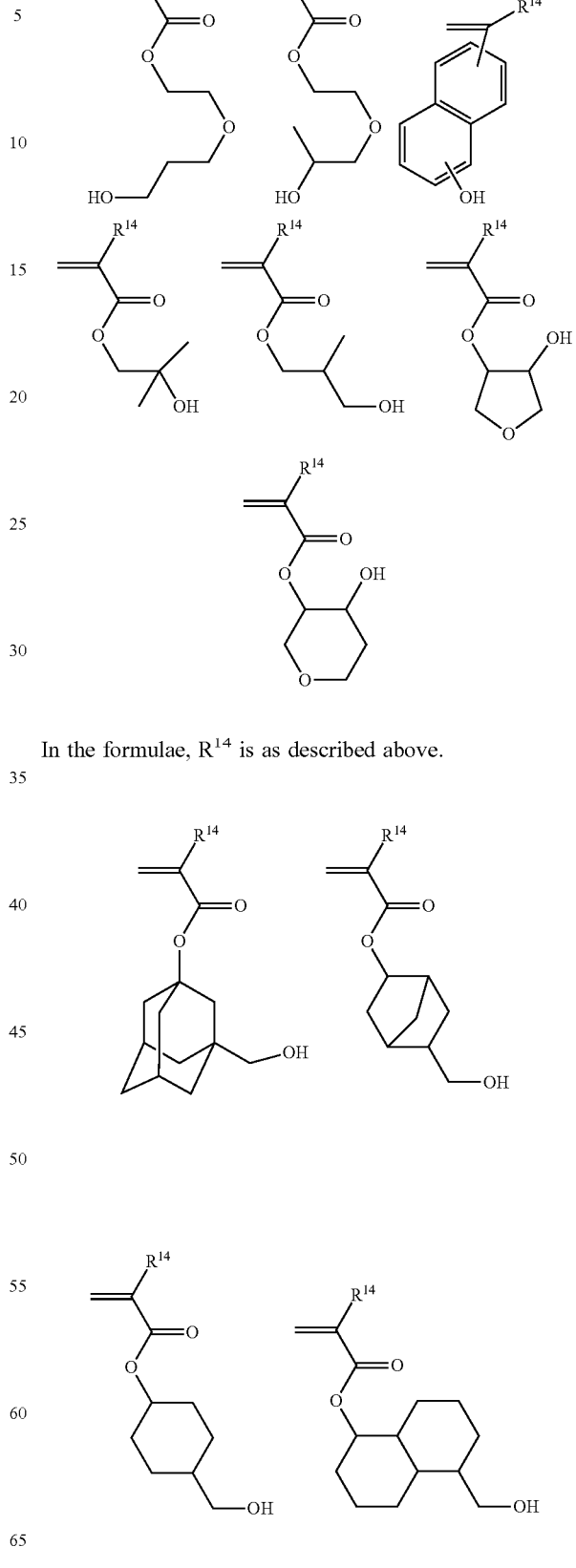
In the formulae, $R^{14}$ is as described above.

-continued
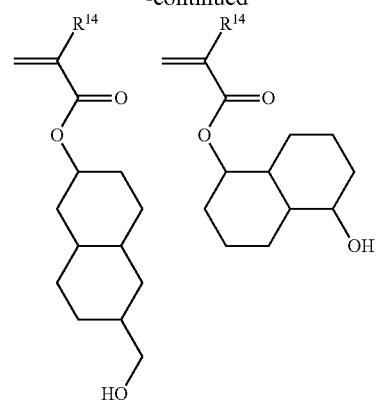
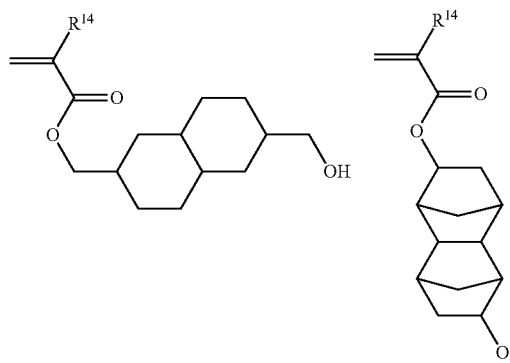
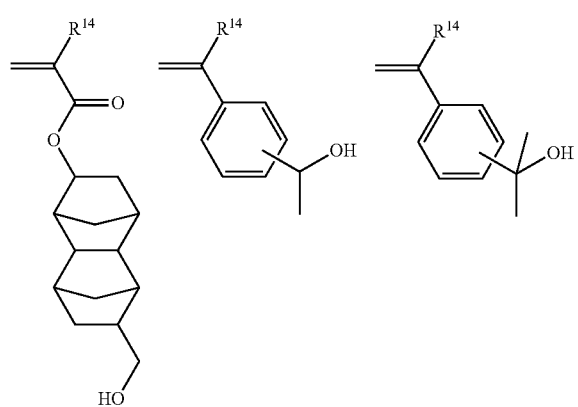
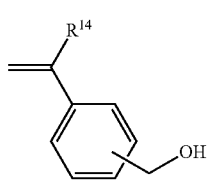
In the formulae, R$^{14}$ is as described above.
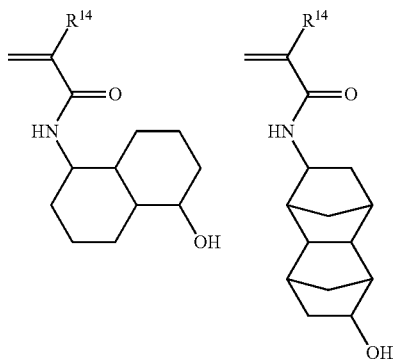
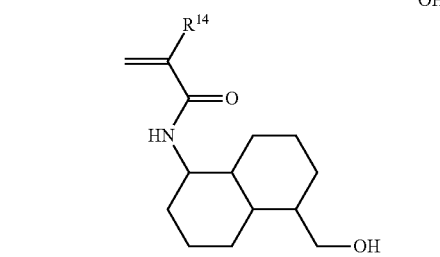
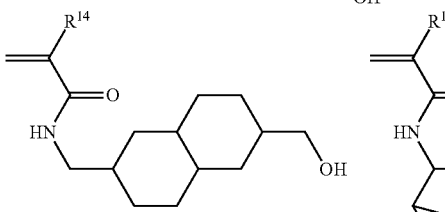
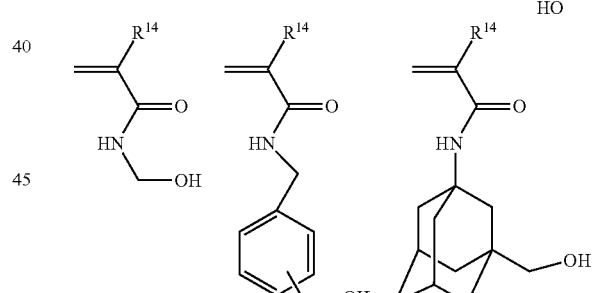
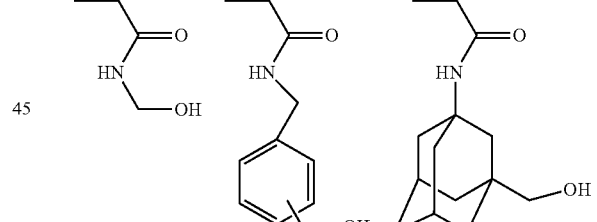
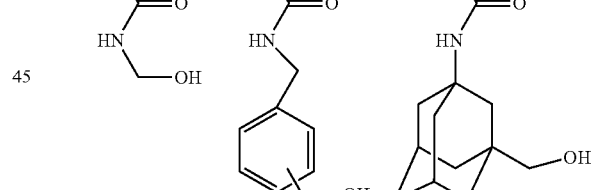
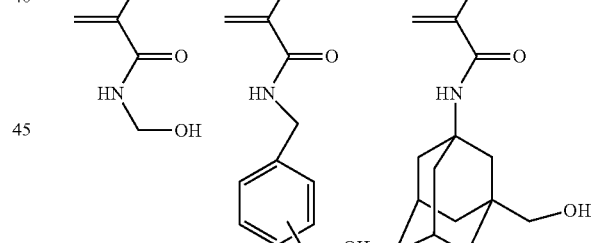
In the formulae, R$^{14}$ is as described above.

Here, the structural units formed by cyclopolymerization shown by the general formulae (1) to (4) are excellent in mechanical strength and heat resistance, but do not have crosslinking property or alkali-solubility. Therefore, the polymer compound of the component (B) is preferably copolymerized with the structural units represented by the general formulae (5) and (5') and the general formula (7), which are excellent in alkali-solubility, and the structural units shown by the epoxy group or oxetanyl group represented by the general formula (6) or the blocked isocyanate group represented by the general formula (α), which have crosslinking property. Such a compound makes it possible to achieve all of mechanical characteristics, alkali-solubility, and crosslinking property more easily than a polymer containing only the structural units shown by the general formulae (1) to (7).

Accordingly, when repeating units are copolymerized in this manner, repeating units of the following formulae (1a) are preferably contained.

(1a)

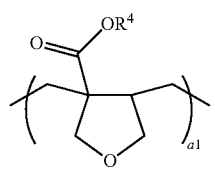
(3)

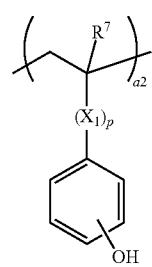
(5)

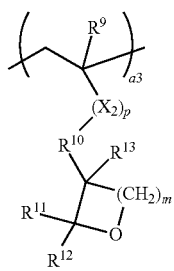
(6)

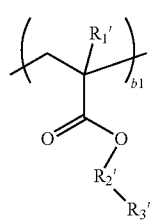
(α)

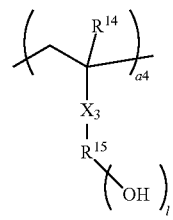
(7)

In the formulae, $0<a1<1.0$, $0<a2<1.0$, $0\le a3<1.0$, $0\le b1<1.0$, $0<a3+b1<1.0$, and $0<a4<1.0$; and one of $0<a1+a2+a3+a4\le 1.0$, $0<a1+a2+b1+a4\le 1.0$, and $0<a1+a2+a3+b1+a4\le 1.0$ is satisfied. $R^4$, $R^7$, $R^9$ to $R^{13}$, $R^{14}$, $R^{15}$, $R_1'$ to $R_3'$, $X_1$, $X_2$, $X_3$, "m", "p", and "l" are the same as described above.

The polymer compound of the component (B) to be used in the present invention may include, as a base, a repeating unit with a monomer for obtaining a structural unit formed by cyclopolymerization represented by the general formulae (1) to (4) (hereinafter, noted as "a"), a monomer for obtaining a repeating unit represented by the general formula (5) and the general formula (7) having a hydroxy group (hereinafter, noted as "b" and "c"), and a monomer for obtaining a repeating unit that is represented by the general formula (6) and the general formula (α) and that has a group crosslinked with the alkali-soluble resin of the component (A) (hereinafter, noted as "d"). It is also possible to copolymerize a monomer for obtaining a repeating unit represented by the following general formula (25) (hereinafter, noted as "e") in order to improve adhesiveness to a substrate and flexibility of a cured film, and to further improve mechanical characteristics and thermal shock resistance.

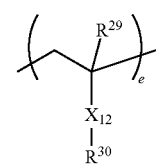
(25)

In the general formula (25), $R^{29}$ represents a hydrogen atom or a methyl group. $R^{30}$ may have a monovalent organic group having a primary, secondary, or tertiary amino group, an alkyl group having 4 to 20 carbon atoms, an aryl group having 6 to 10 carbon atoms, or an alicyclic group having 6 to 10 carbon atoms. $X_{12}$ is preferably —C(=O)—O— or —C(=O)—NH—. "e" satisfies $0\le e<1$.

Specific examples of monomers for obtaining the repeating unit represented by the general formula (25) include the following: aminoethyl(meth)acrylate, N-methylaminoethyl(meth)acrylate, N,N-dimethylaminoethyl(meth)acrylate, N-ethylaminoethyl(meth)acrylate, N,N-diethylaminoethyl(meth)acrylate, aminopropyl(meth)acrylate, N-methylaminopropyl(meth)acrylate, N,N-dimethylaminopropyl(meth)acrylate, N-ethylaminopropyl(meth)acrylate, N,N-diethylaminopropyl(meth)acrylate, aminoethyl(meth)acrylamide, N-methylaminoethyl(meth)acrylamide, N,N-dimethylaminoethyl(meth)acrylamide, N-ethylaminoethyl(meth)acrylamide, N,N-diethylaminoethyl(meth)acrylamide, aminopropyl(meth)acrylamide, N-methylaminopropyl(meth)acrylamide, N,N-dimethylaminopropyl(meth)acrylamide, N-ethylaminopropyl(meth)acrylamide, N,N-diethylaminopropyl(meth)acrylamide, piperidine-4-yl(meth)acrylate, 1-methylpiperidine-4-yl(meth) acrylate, 2,2,6,6-tetramethylpiperidine-4-yl(meth)acrylate, 1,2,2,6,6-pentamethylpiperidine-4-yl(meth)acrylate, (piperidine-4-yl)methyl(meth)acrylate, 2-(piperidine-4-yl)ethyl (meth)acrylate, piperidine-4-yl(meth)acrylate, 1-methylpiperidine-4-yl(meth)acrylate, 2,2,6,6-tetramethylpiperidine-4-yl(meth)acrylate, 1,2,2,6,6-pentamethylpiperidine-4-yl (meth)acrylate, (piperidine-4-yl)methyl(meth)acrylate, 2-(piperidine-4-yl)ethyl(meth)acrylate, and the like.

Furthermore, a (meth)acrylic acid alkyl ester can be used as a monomer for obtaining the repeating unit represented by the general formula (25), and specific examples include (meth)acrylic acid butyl ester, (meth)acrylic acid pentyl ester, (meth)acrylic acid hexyl ester, (meth)acrylic acid heptyl ester, (meth)acrylic acid octyl ester, (meth)acrylic acid nonyl ester, (meth)acrylic acid decyl ester, (meth) acrylic acid undecyl ester, (meth)acrylic acid dodecyl ester, (meth)acrylic acid tridecyl ester, (meth)acrylic acid tetradecyl ester, (meth)acrylic acid pentadecyl ester, (meth) acrylic acid hexadecyl ester, (meth)acrylic acid heptadecyl ester, (meth)acrylic acid octadecyl ester, (meth)acrylic acid nonadecyl ester, (meth)acrylic acid eicosyl ester, and the like.

Furthermore, in order to improve the mechanical strength of the cured film, it is also possible to copolymerize olefins "f" having an aromatic group such as styrenes, vinylnaphthalenes, vinylanthracenes, vinylcarbazoles, acenaphthylenes, indenes, and the like; and alicyclic olefins "g" such as norbornenes, norbornadienes, and the like.

Regarding the repeating units a1, a2, a3, a4, b1, "e", "f", and "g", the proportion of the repeating units is preferably $0<a1<0.8$, $0<a2\leq0.8$, $0\leq a3\leq0.8$, $0<a4\leq0.8$, $0\leq b1\leq0.6$, $0\leq e\leq0.8$, $0\leq f\leq0.8$, and $0\leq g\leq0.8$; more preferably $0<a1\leq0.5$, $0.1\leq a2\leq0.6$, $0.1\leq a3\leq0.6$, $0.1\leq a4\leq0.7$, $0\leq b1\leq0.4$, $0\leq e\leq0.4$, $0\leq f\leq0.4$, and $0\leq g\leq0.4$; and further preferably $0<a1\leq0.4$, $0.1\leq a2\leq0.4$, $0.1\leq a3\leq0.4$, $0.2\leq a4\leq0.7$, $0\leq b1\leq0.2$, $0\leq e\leq0.4$, $0\leq f\leq0.4$, and $0\leq g\leq0.4$. Note that one of $a1+a2+a3+a4=1$, $a1+a2+b1+a4=1$, $a1+a2+a3+b1+a4=1$, and $a1+a2+a3+b1+a4+e+f+g=1$ is preferably satisfied, and the total of these repeating units is preferably 100 mol % of the total amount of all the repeating units.

The (crosslinkable) polymer compound (B) used in the inventive negative photosensitive composition preferably has a weight-average molecular weight of 1,000 to 500,000, in particular, 2,000 to 30,000 in terms of polystyrene determined by gel permeation chromatography (GPC). When the weight-average molecular weight is 1,000 or more, glass transition temperature becomes sufficiently high, so that the pattern does not become deformed in heat crosslinking after development of the negative photosensitive resin composition. When the weight-average molecular weight is 500,000 or less, there is no risk of pinhole defects occurring on application, and no risk of layer separation from the alkali-soluble resin in the pattern formed by lithography patterning. Note that it is also possible to blend two or more polymers having different composition ratios, molecular weight distributions, or molecular weights.

In this event, the (crosslinkable) polymer compound (B) is preferably added in an amount of 10 parts by mass or more and 100 parts by mass or less relative to 100 parts by mass of the alkali-soluble resin (A). When the added amount is 10 parts by mass or more, a cured film with the above-described alkali-soluble resin (A) becomes tough. When the added amount is 100 parts by mass or less, the tensile strength of the cured film does not become degraded. Therefore, the added amount of the (crosslinkable) polymer compound (B) is preferably within the above range. The added amount of the component (B) is more preferably 10 parts by mass or more and 70 parts by mass or less, further preferably 30 parts by mass or more and 50 parts by mass or less. When the amount is set to this range, the balance between the lithography patterning performance and the physical properties of the cured film becomes excellent.

[(C) Compound that Generates Acid by Light]

The compound that generates an acid by light (C) (photoacid generator) used in the present invention can be any compound that generates an acid by light as long as it is a compound that generates an acid by irradiation with a high-energy beam. Suitable compounds include sulfonium salts, iodonium salts, sulfonyldiazomethanes, N-sulfonyloxyimide acid generators, benzoinsulfonate acid generators, pyrogallol trisulfonate acid generators, nitrobenzyl sulfonate acid generators, sulfone acid generators, acid generators in the form of glyoxime derivatives, and the like. Details will be given below, and one of these may be used or a mixture of two or more thereof may be used.

Sulfonium salts are salts of sulfonium cations with sulfonates. Exemplary sulfonium cations include triphenylsulfonium, (4-tert-butoxyphenyl) diphenylsulfonium, bis(4-tert-butoxyphenyl)phenylsulfonium, tris(4-tert-butoxyphenyl)sulfonium, (3-tert-butoxyphenyl) diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, and the like. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy) benzenesulfonate, naphthalenesulfonate, camphorsulfonate, octanesulfonate, dodecylbenzenesulfonate, butanesulfonate, methanesulfonate, and the like. Sulfonium salts based on combination of the foregoing examples are included.

Iodonium salts are salts of iodonium cations with sulfonates. Exemplary iodonium cations are aryliodonium cations including diphenyliodinium, bis(4-tert-butylphenyl) iodonium, 4-tert-butoxyphenylphenyliodonium, 4-methoxyphenylphenyliodonium, and the like. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, methanesulfonate, and the like. Iodonium salts based on combination of the foregoing examples are included.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl) diazomethane, bis (2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photo-acid generators include combinations of imide skeletons with sulfonates. Exemplary imide skeletons include succinimide, naphthalene dicarboxylic acid imide, phthalimide, cyclohexyldicarboxylic acid imide, 5-norbornene-2,3-dicarboxylic acid imide, 7-oxabicyclo[2.2.1]-5-heptene-2,3-dicarboxylic acid imide, and the like. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, and the like.

Benzoinsulfonate photo-acid generators include benzoin tosylate, benzoin mesylate, benzoin butanesulfonate, and the like.

Pyrogallol trisulfonate photo-acid generators include pyrogallol, phloroglucin, catechol, resorcinol, and hydroquinone, in which all the hydroxy groups are substituted with trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, and the like.

Nitrobenzyl sulfonate photo-acid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, and the like. Also useful are analogous nitrobenzyl sulfonate compounds in which the nitro group on the benzyl side is substituted with a trifluoromethyl group.

Examples of sulfone photo-acid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl) propane, 2-methyl-2-(p-toluenesulfonyl)propiophenone, 2-cyclohexylcarbonyl-2-(p-tolueneulfonyl)propane, and 2,4-dimethyl-2-(p-toluenesulfonyl)pentane-3-one.

Examples of photo-acid generators in the form of glyoxime derivatives include bis-o-(p-toluenesulfonyl)-α-dimethylglyoxime, bis-o-(p-toluenesulfonyl)-α-diphenylglyoxime, bis-o-(p-toluenesulfonyl)-(1-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexylsulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, bis-o-(camphorsulfonyl)-α-dimethylglyoxime, and the like.

In particular, preferably used photo-acid generators are bissulfonyldiazomethane and N-sulfonyloxyimide.

Furthermore, an oxime-type acid generator shown in WO 2004/074242 A2 can also be added.

One of the above-described acid generators may be used or a combination of two or more thereof may be used. Onium salts have an excellent effect of enhancing rectangularity, diazomethane derivatives and glyoxime derivatives have an excellent effect of reducing standing waves. Therefore, it is possible to make fine adjustments to profiles by combining the two.

The blending amount of the photo-acid generator in the inventive negative photosensitive resin composition is preferably 0.05 to 20 parts by mass, particularly preferably 1 to 10 parts by mass relative to 100 parts by mass of the component (A). When the blending amount is 0.05 parts by mass or more, sufficient contrast (difference between the exposed parts and the unexposed parts in the speed of dissolution to a developer) can be achieved. When the blending amount is 20 parts by mass or less, there is no risk of resolution being degraded due to light absorption of the acid generator itself.

[(D) Heat Crosslinking Agent]

The heat crosslinking agent (D) to be used in the present invention can be any heat crosslinking agent as long as it is a compound other than the above-described component (B), and is a compound having a group crosslinked with the component (A). Specific examples of crosslinking agents that can be used here include melamine compounds, guanamine compounds, glycoluril compounds, or urea compounds substituted with at least one group selected from a methylol group, an alkoxymethyl group, and an acyloxymethyl group, epoxy compounds, oxetane compounds, isocyanate compounds, azide compounds, compounds having a double bond such as an alkenyl ether group, compounds having benzylalcohol, etc. and oxazoline-based crosslinking agents disclosed in JP H2-60941 A, JP H2-99537 A, and JP H2-115238 A.

Among the specific examples of the crosslinking agents described above, further examples of epoxy compounds include tris(2,3-epoxypropyl)isocyanurate, trimethylol methane triglycidyl ether, trimethylol propane triglycidyl ether, triethylol ethane triglycidyl ether, and the like.

Other examples include those having a hydroxy group of the following compounds converted to a glycidyl ether: phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 4,4'-(9H-fluorene-9-ylidene)bisphenol, 2,2'dimethyl-4,4'-(9H-fluorene-9-ylidene)bisphenol, 2,2'diallyl-4,4'-(9H-fluorene-9-ylidene)bisphenol, 2,2'difluoro-4,4'-(9H-fluorene-9-ylidene)bisphenol, 2,2'diphenyl-4,4'-(9H-fluorene-9-ylidene)bisphenol, 2,2'dimethoxy-4,4'-(9H-fluorene-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol. In addition, examples include novolak resins of the above-described phenolic compounds whose hydroxy group is converted to a glycidyl ether.

Specific examples of the melamine compound include hexamethylolmelamine, hexamethoxymethyl melamine, compounds in which 1 to 6 methylol groups of hexamethylolmelamine are converted into methoxymethyl groups or a mixture thereof, hexamethoxyethyl melamine, hexaacyloxymethyl melamine, and compounds in which 1 to 6 methylol groups of hexamethylolmelamine are converted into acyloxymethyl groups or a mixture thereof. Examples of the guanamine compound include tetramethylol guanamine, tetramethoxymethyl guanamine, compounds in which 1 to 4 methylol groups of tetramethylol guanamine are converted into methoxymethyl groups or a mixture thereof, tetramethoxyethyl guanamine, tetraacyloxy guanamine, and compounds in which 1 to 4 methylol groups of tetramethylol guanamine are converted into acyloxymethyl groups or a mixture thereof. Examples of the glycoluril compound include tetramethylol glycoluril, tetramethoxy glycoluril, tetramethoxymethyl glycoluril, compounds in which 1 to 4 methylol groups of tetramethylol glycoluril are converted into methoxymethyl groups or a mixture thereof, and compounds in which 1 to 4 methylol groups of tetramethylol glycoluril are converted into acyloxymethyl groups or a mixture thereof. Examples of the urea compound include tetramethylolurea, tetramethoxymethylurea, compounds in which 1 to 4 methylol groups of tetramethylolurea are converted into methoxymethyl groups or a mixture thereof, and tetramethoxyethylurea.

Illustrative examples of the isocyanate compound include trilene diisocyanate, diphenylmethane diisocyanate, hexamethylene diisocyanate, and cyclohexane diisocyanate. Illustrative examples of the azide compound include 1,1'-biphenyl-4,4'-bisazide, 4,4'-methylidenebisazide, and 4,4'-oxybisazide.

Illustrative examples of the compound containing an alkenyl ether group include ethyleneglycol divinyl ether, triethyleneglycol divinyl ether, 1,2-propanediol divinyl ether, 1,4-butanediol divinyl ether, tetramethyleneglycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylolpropane trivinyl ether.

Further examples include cyclic epoxy compounds disclosed in JP H11-100378 A, JP 2003-231860 A, JP 2005-146038 A, JP 2005-290052 A, JP 2006-199790 A, and JP 2006-273748 A; crosslinking agents having an oxirane ring bonded to a ring disclosed in JP 2006-348252 A; epoxy crosslinking agents having a dendrimer or a hyperbranched polymer as a base disclosed in JP 2008-24920 A; crosslinking agents having both a hydroxy group and an oxetanyl group disclosed in JP 2001-310937 A; and crosslinking agents having both a hydroxy group and an epoxy group disclosed in JP 3824286 B.

An epoxy group has a great distortion in the ring and has high reactivity, but oxetane has high basicity and is easily bonded with an acid. It is reported that reactivity in cation polymerization is remarkably improved by combining an epoxy group with an oxetanyl group.

Furthermore, the component (D) in the inventive negative photosensitive resin composition is more preferably one or more kinds of crosslinking agents selected from an amino condensate modified by formaldehyde or formaldehyde-alcohol; and a phenol compound having two or more methylol groups or alkoxymethylol groups by average in one molecule.

Examples of the amino condensates modified by the formaldehyde or formaldehyde-alcohol include a melamine condensate modified by the formaldehyde or formaldehyde-alcohol, and a urea condensate modified by the formaldehyde or formaldehyde-alcohol.

The melamine condensate modified by the formaldehyde or formaldehyde-alcohol is prepared, for example, in such a manner that, firstly, according to a well-known method, a melamine monomer is modified by methylol reaction with formalin, or this is further modified by alkoxylation with alcohol, thus modified melamine represented by the following general formula (26) is obtained. As the alcohol, a lower alcohol, for example alcohols having 1 to 4 carbon atoms is preferable.

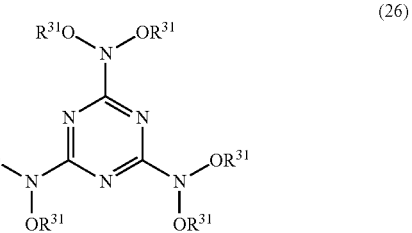

(26)

In the formula, $R^{31}$s may be the same or different from each other, and are methylol groups, alkoxymethyl groups containing an alkoxy group having 1 to 4 carbon atoms, or hydrogen atoms, and at least one $R^{31}$ is a methylol group or the alkoxymethyl group.

Examples of the $R^{31}$ include a hydrogen atom, a methylol group, and alkoxymethyl groups such as a methoxymethyl group, and an ethoxymethyl group.

Specific examples of the modified melamine represented by the general formula (26) include trimethoxymethylmonomethylol melamine, dimethoxymethylmonomethylol melamine, trimethylol melamine, hexamethylol melamine, and hexamethoxymethylol melamine.

Next, the modified melamine represented by the general formula (26) or its multimer (for example, an oligomer such as a dimer or a trimer) is subjected to addition condensation polymerization with formaldehyde until a desired molecular weight is obtained according to the conventional method to obtain a melamine condensate modified by formaldehyde or formaldehyde-alcohol.

The urea condensate modified by the formaldehyde or formaldehyde-alcohol is prepared, according to, for example, a well-known method, by modifying a urea condensate having a desired molecular weight by methylol reaction with formaldehyde, or by further modifying by alkoxylation with alcohol.

Specific examples of the urea condensate modified by the formaldehyde or formaldehyde-alcohol include a methoxymethylated urea condensate, an ethoxymethylated urea condensate, a propoxymethylated urea condensate, and the like.

One of these modified melamine condensates and modified urea condensates may be used or two or more kinds thereof may be used in mixture.

Next, examples of the phenol compound having two or more methylol groups or alkoxymethylol groups in average in one molecule include (2-hydroxy-5-methyl)-1,3-benzenedimethanol, 2,2',6,6'-tetramethoxymethylbisphenol A, compounds represented by the following formulae (D-3) to (D-7), and the like.

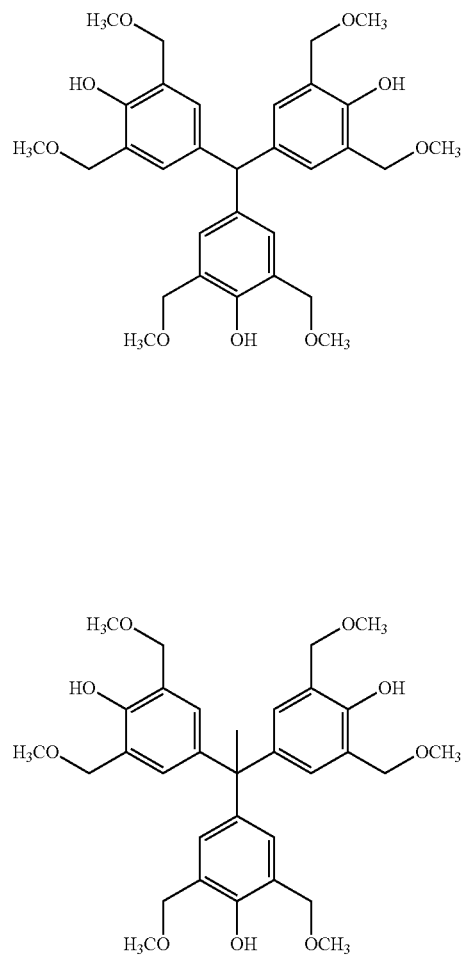

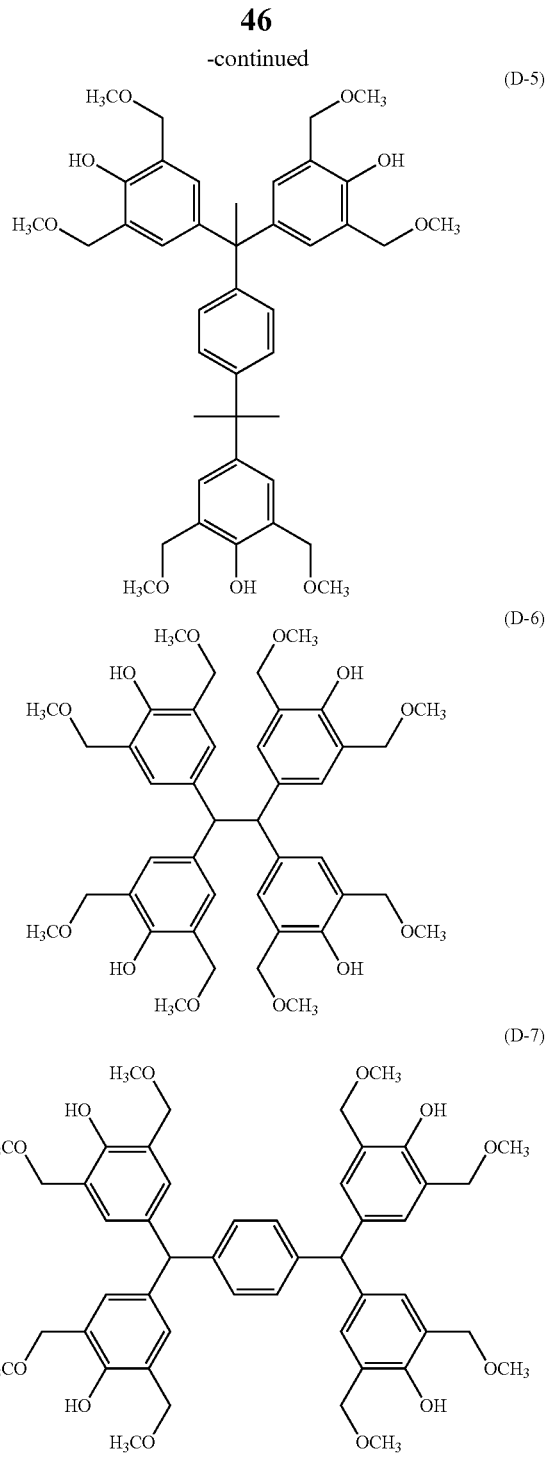

One of the crosslinking agents may be used or two or more kinds may be used in combination.

The component (D) undergoes a crosslinking reaction with the components (A) and (B) in the PEB step of the inventive negative photosensitive resin composition with the acid generated from the component (C) as a catalyst. Furthermore, the component (D) is a component that causes a crosslinking reaction in the subsequent post-curing to further increase the strength of a cured product. A weight-average molecular weight of such a component (D) is preferably 150 to 10,000, and particularly preferably 200 to 3,000, from the viewpoint of the photocurability and heat resistance.

Furthermore, in the inventive negative photosensitive resin composition, a blending amount of the component (D) is preferably 0.5 to 50 parts by mass, and particularly preferably 1 to 30 parts by mass relative to 100 parts by mass of the component (A).

[(E) Basic Compound]

The inventive negative photosensitive resin composition can further contain, in addition to the components (A), (B), (C), and (D) that are essential Components, (E) a basic compound. The component (E) basic compound is suitably a compound which can suppress a diffusion rate of the acid generated from the photo-acid generator when the acid is diffused in the resist film. By blending such a basic compound, the diffusion rate of the acid in the resist film is suppressed, so that resolution can be improved, change in sensitivity after exposure can be suppressed, a substrate or environment dependency can be reduced, and exposure margin or pattern profile, etc. can be improved.

Examples of the basic compound include primary, secondary and tertiary aliphatic amines, mixed amines, aromatic amines, heterocyclic amines, a nitrogen-containing compound having a carboxy group, a nitrogen-containing compound having a sulfonyl group, a nitrogen-containing compound having a hydroxy group, a nitrogen-containing compound having a hydroxyphenyl group, an alcoholic nitrogen-containing compound, amide derivatives, imide derivatives, etc.

Specifically, examples of the primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, etc. Examples of the secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine, etc. Examples of the tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentamine, etc.

Examples of the mixed amines include dimethylethylamine, methylethylpropylamine, benzylamine, a phenethyl amine, benzyldimethylamine, etc. Specific examples of the aromatic amines and the heterocyclic amines include aniline derivatives (for example, aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, etc.), diphenyl(p-tolyl) amine, methyldiphenylamine, triphenylamine, phenylenediamine, naphthylamine, diaminonaphthalene, pyrrole derivatives (for example, pyrrole, 2H-pyrrole, 1-methylpyrrole, 2,4-dimethylpyrrole, 2,5-dimethylpyrrole, N-methylpyrrole, etc.), oxazole derivatives (for example, oxazole, isoxazole, etc.), thiazole derivatives (for example, thiazole, isothiazole, etc.), imidazole derivatives (for example, imidazole, 4-methylimidazole, 4-methyl-2-phenylimidazole, etc.), pyrazole derivatives, furazan derivatives, pyrroline derivatives (for example, pyrroline, 2-methyl-1-pyrroline, etc.), pyrrolidine derivatives (for example, pyrrolidine, N-methylpyrrolidine, pyrrolidinone, N-methylpyrrolidone, etc.), imidazoline derivatives, imidazolidine derivatives, pyridine derivatives (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, dimethylaminopyridine, etc.), pyridazine derivatives, pyrimidine derivatives, pyrazine derivatives, pyrazoline derivatives, pyrazolidine derivatives, piperidine derivatives, piperadine derivatives, morpholine derivatives, indole derivatives, isoindole derivatives, 1H-indazole derivatives, indoline derivatives, quinoline derivatives (for example, quinoline, 3-quinolinecarbonitrile, etc.), isoquinoline derivatives, cinnoline derivatives, quinazoline derivatives, quinoxaline derivatives, phthalazine derivatives, purine derivatives, puteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, uridine derivatives, etc.

Furthermore, examples of the nitrogen-containing compound having a carboxy group include aminobenzoic acid, indolecarboxylic acid, amino acid derivatives (for example, nicotinic acid, alanine, arginine, aspartic acid, glutamic acid, glycine, histidine, isoleucine, glycyrleucine, leucine, methionine, phenylalanine, threonine, lysine, 3-aminopyrazine-2-carboxylic acid, methoxyalanine, etc.), etc. Examples of the nitrogen-containing compound having a sulfonyl group include 3-pyridine sulfonic acid, pyridinium p-tolueneslfonate, etc. Examples of the nitrogen-containing compound having a hydroxy group, the nitrogen-containing compound having a hydroxyphenyl group, and the alcoholic nitrogen-containing compound include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperadine, 1-[2-(2-hydroxyethoxy)ethyl]piperadine, piperidineethanol, 1-(2-hydroxyethyl) pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridine ethanol, N-(2-hydroxyethyl) phthalimide, N-(2-hydroxyethyl)isonicotinamide, etc. Examples of the amide derivatives include formamide, N-methylformamide, N,N-dimethylformamide, acetamide, N-methylacetamide, N,N-dimethylacetamide, propionamide, benzamide, etc. Examples of the imide derivatives include phthalimide, succinimide, maleimide, etc.

One kind of the basic compound can be used or a combination of two or more kinds can be used. When 0 to 2 parts by mass of the basic compound is to be blended relative to 100 parts by mass of the component (A) alkali-soluble resin, a basic compound being a mixture with the blending amount of 0.01 to 2 parts by mass, in particular, 0.01 to 1 part by mass is suitable. When the blending amount is 2 parts by mass or less, sufficient sensitivity can be sustained.

[(F) Thermal Acid Generator]

The inventive negative photosensitive resin composition may further contain (F) a compound that generates an acid by heat (thermal acid generator). The compound generating an acid by heat of the component (F) may be added to thermally expedite a crosslinking reaction of the component (A) with the component (B) and the component (D) in a step of heating and post-curing in a temperature of 100 to 300° C. performed after the pattern formation.

In particular, as the component (F), a preferable component is one that does not encourage the curing of a film and does not disturb the pattern formation until a pattern is formed by development. In order to realize this, the component (F) is preferably one that, after the photosensitive resin composition is applied, does not generate an acid at a temperature in a step of removing a solvent and drying, but generates an acid by a heat treatment after pattern formation to encourage the curing of the pattern or a film of the negative photosensitive resin composition. Specifically, a compound that is decomposed by a heat treatment at 100° C. to 300° C., preferably at 150° C. to 300° C. to generate an acid is preferable. By containing such a component (F), crosslinking and curing reaction of the pattern or the film of the negative photosensitive resin composition can be further promoted in the step of heating and post-curing at a temperature of 100 to 300° C. after patterning. The component (F) makes it possible to further improve the mechanical strength, the chemical resistance, the adhesiveness or the like of the obtained pattern or film by further forwarding the crosslinking and the curing reaction.

As the compound that generates an acid by a suitable heat, compounds described in paragraphs [0061] to [0085] of JP 2007-199653 A may be exemplified.

A blending amount of the compound that generates an acid by heat is preferably 0.1 parts by mass or larger, more preferably 0.5 parts by mass or larger, and preferably 30 parts by mass or smaller, and more preferably 5 parts by mass or smaller relative to 100 parts by mass of the component (A) in the inventive negative photosensitive resin composition. When the contained amount is 0.1 parts by mass or larger, the crosslinking reaction can be promoted. Meanwhile, when the contained amount is 30 parts by mass or smaller, alkali developing properties of the composition are not degraded, so that development residue is not generated.

[(G) Antioxidant]

The inventive negative photosensitive resin composition can further contain a component (G), an antioxidant. Degradation of an aliphatic group or a phenolic hydroxy group of the component (A) by oxidation can be suppressed by the component (G) antioxidant being contained. In addition, by an anticorrosive effect to metal materials, it is possible to suppress oxidation of metal by water from outside, a photoacid generator, or a thermal acid generator, etc. and accompanying adhesion degradation and delamination.

Specific examples of antioxidants that can be used here include hindered phenol-based antioxidants, phosphorus-based antioxidants, and sulfur-based antioxidants as preferable examples. However, the antioxidant is not limited thereto. Moreover, one of these antioxidants can be used or two or more thereof can be used in combination.

Furthermore, out of the above-described specific examples of antioxidants, examples of the hindered phenol-based antioxidants include pentaerythritol tetrakis[3-(3,5-di-tert-butyl-4-hydroxyphenyl)propionate] (Irganox 1010 (trade name), manufactured by BASF Japan Ltd.), thiodiethylenebis[3-(3,5-di-tert-butyl-4-hydroxyphenyl)propionate] (Irganox 1035 (trade name), manufactured by BASF Japan Ltd.), octadecyl[3-(3,5-di-tert-butyl-4-hydroxyphenyl)propionate] (Irganox 1076 (trade name), manufactured by BASF Japan Ltd.), octyl-1-3,5-di-tert-butyl-4-hydroxyhydrocinnamic acid (Irganox 1135 (trade name), manufactured by BASF Japan Ltd.), 4,6-bis(octylthiomethyl-o-cresol) (Irganox 1520L, manufactured by BASF Japan Ltd.), Sumilizer GA80 (trade name, manufactured by Sumitomo Chemical Co., Ltd.), Adekastab AO-20 (trade name, manufactured by ADEKA CORPORATION), Adekastab AO-30 (trade name, manufactured by ADEKA CORPORATION), Adekastab AO-40 (trade name, manufactured by ADEKA CORPORATION), Adekastab AO-50 (trade name, manufactured by ADEKA CORPORATION), Adekastab AO-60 (trade name, manufactured by ADEKA CORPORATION), Adekastab AO-80 (trade name, manufactured by ADEKA CORPORATION), Adekastab AO-330 (trade name, manufactured by ADEKA CORPORATION), hindered phenol-based antioxidants disclosed in WO 2017/188153 A1, and the like.

Furthermore, out of the above-described specific examples of antioxidants, examples of the phosphorus-based antioxidants include triphenyl phosphite, tris(methylphenyl) phosphite, triisooctyl phosphite, tridecyl phosphite, tris(2-ethylhexyl) phosphite, tris(nonylphenyl) phosphite, tris(octylphenyl) phosphite, trisdecylpoly(oxyethylene) phosphite, tris(cyclohexylphenyl) phosphite, tricyclohexyl phosphite, tri(decyl)thio phosphite, triisodecylthio phosphite, phenyl-bis(2-ethylhexyl) phosphite, phenyl-diisodecyl phosphite, tetradecylpoly(oxyethylene)-bis(ethylphenyl) phosphite, phenyl-dicyclohexyl phosphite, phenyl-diisooctyl phosphite, phenyl-di(tridecyl) phosphite, diphenyl-cyclohexyl phosphite, diphenyl-isooctyl phosphite, diphenyl-2-ethylhexyl phosphite, diphenyl-isodecyl phosphite, diphenyl-cyclohexylphenyl phosphite, diphenyl-(tridecyl)thio phosphite, and the like.

Furthermore, out of the above-described specific examples of antioxidants, examples of the sulfur-based antioxidants include Adekastab AO-412S (trade name, manufactured by ADEKA CORPORATION), AO-503S (trade name, manufactured by ADEKA CORPORATION), Sumilizer TP-D (trade name, manufactured by Sumitomo Chemical Co., Ltd.), and the like.

Sulfur-based antioxidants and phosphorus-based antioxidants can be expected to have an effect of decomposing peroxides.

The contained amount of the component (G) antioxidant is preferably 0.1 to 10 parts by mass, more preferably 0.2 to 5 parts by mass relative to 100 parts by mass of the component (A) alkali-soluble resin. When the contained amount is 0.1 parts by mass or more, adhesiveness to metal materials is enhanced, while at the same time, delamination is suppressed. Meanwhile, when the contained amount is 10 parts by mass or less, the alkali developing properties of the composition and the toughness of the cured film are not degraded.

[(H) Silane Compound]

The inventive negative photosensitive resin composition can further contain a component (H), a silane compound. When the component (H) silane compound is contained, not only is the adhesiveness to metal materials enhanced, it is also possible to suppress the delamination of the cured film in reliability tests such as a thermal shock test and a high temperature and high humidity test.

A silane compound that can be used here can be any silane compound as long as the silane compound has an alkoxysilyl group. Suitable, specific examples include the following: γ-glycidoxypropyltriethoxysilane, γ-glycidoxypropyltrimethoxysilane, 2-(3,4-epoxycyclohexyl)ethyltrimethoxysilane, bis(2-hydroxyethyl)-3-aminopropyl-triethoxysilane, γ-aminopropyltrimethoxysilane, γ-aminopropyltriethoxysilane, vinyltriethoxysilane, vinyltrimethoxysilane, γ-methacryloxypropyltrimethoxysilane, γ-acryloxypropyltrimethoxysilane, 3-mercaptopropyltrimethoxysilane, 3-isocyanatepropyltriethoxysilane, bis(2-hydroxyethyl)-3-aminopropyltriethoxysilane, triethoxysilylpropylethyl carbamate, 3-(triethoxysilyl)propyl succinic anhydride, phenyltriethoxysilane, phenyltrimethoxysilane, N-phenyl-3-aminopropyltrimethoxysilane, 3-triethoxysilyl-N-(1,3-dimethylbutylidene)propylamine, amide group-containing silane compounds disclosed in JP 6414060 B, thiourea group-containing silane compounds disclosed in WO 2016/140024 A and JP 5987984 B, thiol group-containing silane compounds disclosed in JP 2017-044964 A, and the like. However, the silane compound is not limited thereto. Furthermore, one of these silane compounds can be used or a combination of two or more thereof can be used.

The contained amount of the silane compound (H) is preferably 0.1 to 20 parts by mass, more preferably 1 to 10 parts by mass, and further preferably 3 to 6 parts by mass relative to 100 parts by mass of the component (A) alkali-soluble resin. With 0.1 parts by mass or more, more sufficient adhesiveness with a substrate can be provided, and when 20 parts by mass or less, it is possible to further suppress the problem of increasing viscosity or the like when storing at room temperature. Meanwhile, when the contained amount is less than 10 parts by mass, development residue due to the degradation of the alkali developing properties of the composition can be suppressed more certainly.

[Other Components]

In the inventive negative photosensitive resin composition, components other than the components (A), (B), (C), (D), (E), (F), (G), and (H) may be further contained. Examples of such other components include (I) a dissolution inhibitor, (J) a surfactant, (K) a solvent, and the like. The compounds exemplified below or the like can be suitably used. However, the compounds are not limited thereto.

Examples of the dissolution inhibitor (I) include compounds having two or more phenolic hydroxy groups in a molecule, where an average of 0 to 100 mol % of the hydrogen atoms of the phenolic hydroxy groups are substituted with acid-labile groups as a whole; or compounds having a carboxy group in a molecule, where an average of 50 to 100 mol % of the hydrogen atoms of the carboxy groups are substituted with acid-labile groups as a whole. In addition, the compounds have a weight-average molecular weight of 100 to 1,000, preferably 150 to 800.

The degree of substitution of the hydrogen atoms in the phenolic hydroxy groups with the acid-labile groups is, on average, 0 mol % or higher, preferably 30 mol % or higher of all the phenolic hydroxy groups, and the upper limit of the degree is 100 mol %, more preferably 80 mol %. The degree of substitution of the hydrogen atoms in the carboxy groups with the acid-labile groups is, on average, 50 mol % or higher, preferably 70 mol % or higher of all the carboxy groups, and the upper limit of the degree is 100 mol %.

In this case, compounds represented by the following formulae (I1) to (I15) are preferable as the compounds having two or more phenolic hydroxy groups or the compounds having a carboxy group.

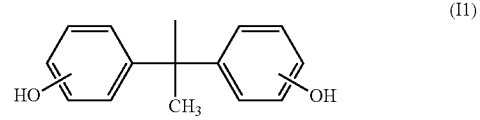

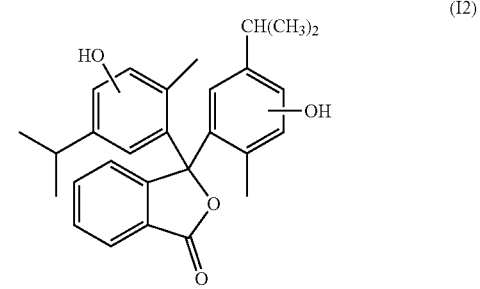

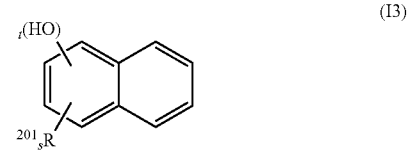

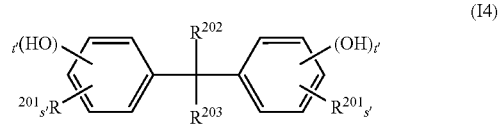

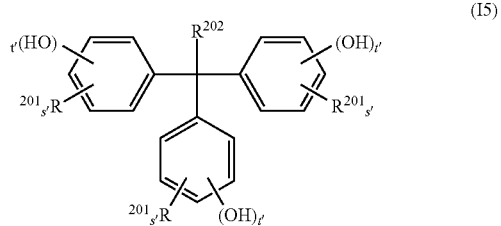

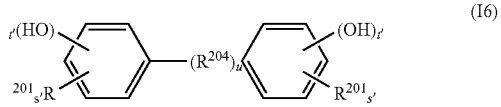

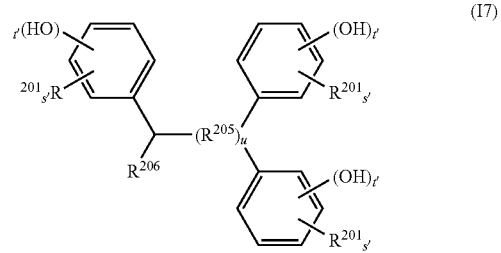

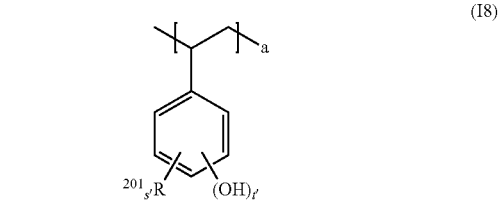

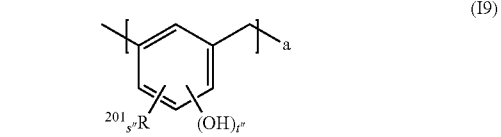

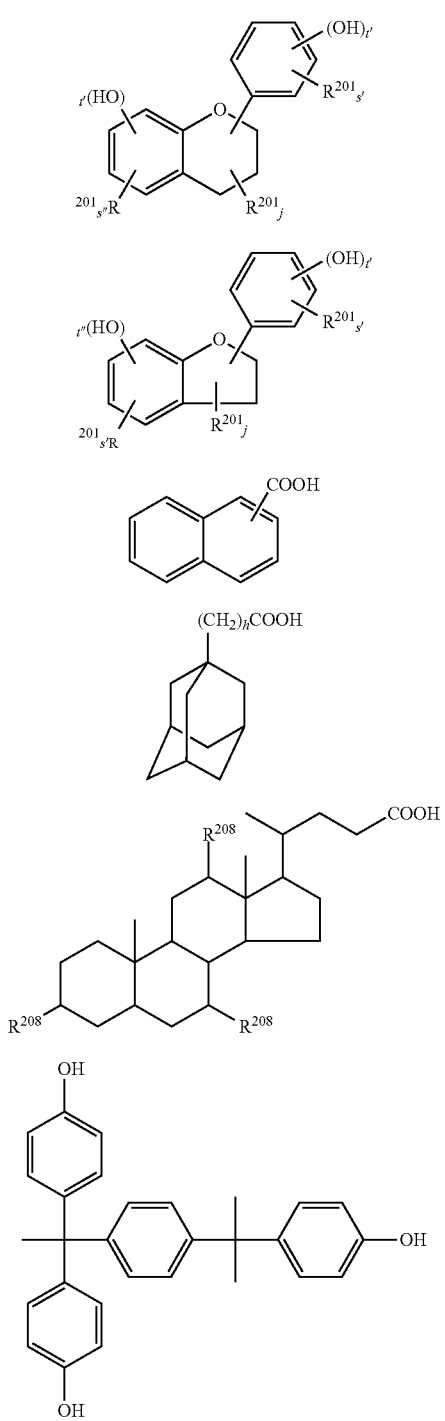

In the formulae, $R^{201}$ and $R^{202}$ each represent a hydrogen atom or a linear or branched alkyl group or alkenyl group having 1 to 8 carbon atoms. $R^{203}$ represents a hydrogen atom or a linear or branched alkyl group or alkenyl group having 1 to 8 carbon atoms. $R^{204}$ represents —$(CH_2)_i$— (i=2 to 10), an arylene group having 6 to 10 carbon atoms, a carbonyl group, a sulfonyl group, an oxygen atom, or a sulfur atom. $R^{205}$ represents an alkylene group having 1 to 10 carbon atoms, an arylene group having 6 to 10 carbon atoms, a carbonyl group, a sulfonyl group, an oxygen atom, or a sulfur atom. $R^{206}$ represents a hydrogen atom, a linear or branched alkyl group or alkenyl group having 1 to 8 carbon atoms, or a phenyl group or a naphthyl group each substituted with a hydroxy group. $R^{208}$ represents a hydrogen atom or a hydroxy group. "j" is an integer of 0 to 5. "u" and "h" are 0 or 1. "s", "t", "s'", "t'", "s''", and "t''" each satisfy s+t=8, s'+t'=5, and s''+t''=4, and are numbers such that there is at least one hydroxy group in each phenyl skeleton. "a" is a number that gives a molecular weight of 100 to 1,000 to the compounds of the formulae (I8) and (I9).

The blending amount of the dissolution inhibitor is 0 to 50 parts by mass, preferably 5 to 50 parts by mass, more preferably 5 to 20 parts by mass relative to 100 parts by mass of the component (A) alkali-soluble resin. One dissolution inhibitor can be used or a mixture of two or more thereof can be used. When the blending amount is 5 parts by mass or more, resolution can be enhanced with more certainty, and when the amount is 50 parts by mass or less, film loss of patterns does not occur, so that high resolution can be achieved.

As the surfactant (J), a nonionic surfactant is preferable. Examples thereof include fluorinated surfactants, specifically, perfluoroalkyl polyoxyethylene ethanol, fluorinated alkyl ester, perfluoroalkylamine oxide, a fluorine-containing organosiloxane compound, a nonfluorinated organosiloxane compound, and the like.

As these surfactants, commercially available ones may be used. Examples thereof include Fluorad FC-4430 (trade name, manufactured by Sumitomo 3M Limited), PF-6320 (trade name, manufactured by OMNOVA Solutions Inc.), PF-636 (trade name, manufactured by OMNOVA Solutions Inc.), Surflon S-141 and S-145 (both trade names, manufactured by ASAHI GLASS CO., LTD.), UNIDYNE DS-401, DS-4031, and DS-451 (all trade names, manufactured by DAIKIN INDUSTRIES, LTD.), Megafac F-8151 (trade name, manufactured by DIC Corporation), X-70-093 (trade name, manufactured by Shin-Etsu Chemical Co., Ltd.), etc. Among these, preferred are Fluorad FC-4430 (trade name, manufactured by Sumitomo 3M Limited), PF-6320 (trade name, manufactured by OMNOVA Solutions Inc.), PF-636 (trade name, manufactured by OMNOVA Solutions Inc.), and X-70-093 (trade name, manufactured by Shin-Etsu Chemical Co., Ltd.).

The blending amount of the surfactant is preferably 0.01 to 5 parts by mass, more preferably 0.01 to 3 parts by mass relative to 100 parts by mass of the component (A) alkali-soluble resin.

The solvent (K) is not limited as long as it can dissolve the component (A), the component (B), the component (C), and the component (D). Examples of the solvent include: ketones such as cyclohexanone, cyclopentanone, methyl-2-n-amyl ketone, and the like; alcohols such as 3-methoxybutanol, 3-methyl-3-methoxybutanol, 1-methoxy-2-propanol, 1-ethoxy-2-propanol, and the like; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether, and the like; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol-mono-tert-butyl ether acetate, γ-butyrolactone, and the like. One or more kinds thereof may be used. In particular, ethyl lactate, cyclohexanone, cyclopentanone, propylene glycol monomethyl ether acetate, γ-butyrolactone or a mixed solvent thereof is preferable.

A blending amount of the component (K) is preferably 50 to 2,000 parts by mass, particularly preferably 100 to 1,000 parts by mass relative to 100 parts by mass of the total of the blending amounts of the component (A), the component (B), the component (C), and the component (D).

(Patterning Process)

The present invention provides a patterning process including the following steps.

(1) A step of forming a photosensitive material film by coating a substrate with the above-described negative photosensitive resin composition;

(2) subsequently, after a heat treatment, a step of exposing the photosensitive material film with a high-energy beam having a wavelength of 190 to 500 nm or an electron beam via a photomask; and (3) after irradiation, a step of developing the substrate, which has been heat-treated, with a developer of an alkaline aqueous solution.

In the following, a patterning process using the inventive negative photosensitive resin composition will be described.

In the inventive negative photosensitive resin composition, in order to form a pattern, a well-known lithography technology may be adopted and performed. For example, on a silicon wafer, a $SiO_2$ substrate, a SiN substrate, or a substrate on which a pattern such as copper wiring is formed, the negative photosensitive resin composition is applied by a technique of spin-coating (spin-coating method), followed by prebaking under the condition at 80 to 130° C. and for about 50 to 600 seconds to form a photosensitive material film having a thickness of 1 to 50 µm, preferably 1 to 30 µm, and further preferably 1 to 20 µm.

According to the spin-coating method, after dispensing about 5 mL of the negative photosensitive resin composition on such a silicon substrate, the negative photosensitive resin composition may be applied on the substrate by rotating the substrate. At this time, by adjusting the rotation rate, a film thickness of the photosensitive material film on the substrate may be readily adjusted.

Subsequently, by holding a mask for forming a target pattern over the photosensitive material film, a high-energy beam of a wavelength of 190 to 500 nm such as an i-line and a g-line or an electron beam is used for irradiation such that an exposure dose is about 1 to 5,000 $mJ/cm^2$, preferably about 100 to 2,000 $mJ/cm^2$.

Next, a heat treatment after exposure (post-exposure bake (PEB)) is performed on a hot plate at 60 to 150° C. for 50 to 600 seconds, preferably at 80 to 120° C. for 60 to 300 seconds, for example.

Subsequently, the development is applied. In the inventive negative photosensitive resin composition, an alkaline development using an alkaline aqueous solution may be applied.

Examples of the aqueous alkaline solution that can be favorably used for the alkali development include a 2.38% aqueous tetramethylammonium hydroxide (TMAH) solution. The development may be performed according to an ordinary method such as a spray method and a paddle method by dipping in the developer, or the like. After that, as needs arise, by performing cleaning, rinsing, drying, and so forth, a resist film having a desired pattern may be obtained.

(Method for Forming Cured Film)

The film having a pattern obtained by the patterning process may be heated and post-cured with an oven or a hot plate at a temperature of 100 to 300° C., preferably 150 to 300° C., more preferably 180 to 250° C. to form a cured film. The post-curing temperature of 100 to 300° C. allows the film of the negative photosensitive resin composition to increase the crosslinking density and to remove remaining volatile components. Thus, this temperature range is preferable in view of adhesiveness to a substrate, heat resistance, strength, and electric characteristics. The time for the post-curing can be 10 minutes to 10 hours.

The formed pattern is used for the purpose of a protective coating for covering wirings, circuits, substrates, and the like. The formed patterns and protective coatings, while having excellent insulation property, exhibit excellent adhesive force on a metal layer such as Cu of wirings and circuits to be covered, on a metal electrode existing on the substrate, or on an insulating substrate such as SiN existing in wirings and circuits to be covered, and make it possible, while having the mechanical strength appropriate as a protective coating, to remarkably improve the resolution performance for enabling a finer pattern formation.

(Cured Film)

The cured film thus obtained is excellent in the adhesiveness to the substrate, heat resistance, electric characteristics, mechanical strength, and chemical resistance to an alkaline release liquid, and the like, and also excellent in reliability of a semiconductor device using the film as a protective coating. In particular, it is possible to prevent occurrence of cracks in the temperature cycle test, and the film can be suitably used as a protective coating (an interlayer insulation film or a surface protective film) for electric and electronic parts, a semiconductor device, and the like.

That is, the present invention provides an interlayer insulation film or a surface protective film made of the cured film obtained by curing the negative photosensitive resin composition.

The above protective coating is useful for an insulator film for a semiconductor device including rewiring use, an insulator film for a multilayer printed substrate, a solder mask, a cover lay film, etc. because of its heat resistance, chemical resistance, and insulating property.

Furthermore, the present invention provides an electronic component having the interlayer insulation film or the surface protective film. Such an electronic component is excellent in reliability because the electronic component has the protective coating (interlayer insulation film or surface protective film) having heat resistance, chemical resistance, and insulation property.

EXAMPLE

Hereinafter, the present invention will be specifically described with reference to Synthesis Examples, Examples, and Comparative Examples. However, the present invention is not limited to the following Examples or the like. Note that the weight-average molecular weight (Mw) indicates a weight-average molecular weight measured by GPC in terms of polystyrene.

I. Synthesis of Alkali-Soluble Resin (A)

In the following Synthesis Examples, chemical structures and names of the used compounds are shown below.

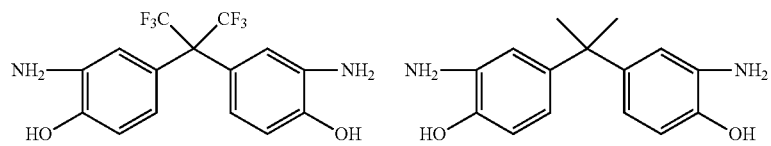

6FAP          BAP          PAP

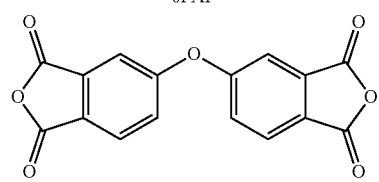

s-ODPA

DC-1

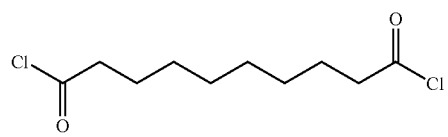

X-1

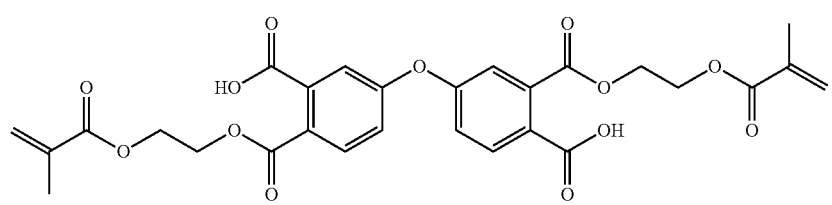

[Synthesis Example 1] Synthesis of Polyimide Resin (A1)

Into a 1-L flask provided with a stirrer and a thermometer, 30 g (81.9 mmol) of 2,2-bis(3-amino-4-hydroxyphenyl)hexafluoropropane (6FAP), 0.9 g (8.6 mmol) of 4-aminophenol (PAP) and 125 g of N-methyl-2-pyrrolidone were added, followed by dissolving by stirring at room temperature. Next, under room temperature, a solution in which 26.7 g (86.2 mmol) of 3,3',4,4'-oxydiphthalic dianhydride (s-ODPA) was dissolved in 270 g of N-methyl-2-pyrrolidone was dropped thereto, followed by stirring for 3 hours under room temperature after dropping. Thereafter, 40 g of xylene was added to the reaction liquid, followed by heating and refluxing for 3 hours while removing water generated at 170° C. outside the system. After cooling to room temperature, the reaction liquid was dropped into 2 L of ultrapure water under stirring, a precipitate was filtered to be washed appropriately with water, followed by drying under reduced pressure at 40° C. for 48 hours. Thus, a polyimide resin (A1) was obtained. A molecular weight of the polymer was measured by GPC. A weight-average molecular weight was 35,000 in terms of polystyrene.

[Synthesis Example 2] Synthesis of Polyimide Resin (A2)

A polyimide resin (A2) was obtained by the same method as Synthesis Example 1, except that the 30 g (81.9 mmol) of 2,2-bis(3-amino-4-hydroxyphenyl)hexafluoropropane (6FAP) was changed to 21.2 g (81.9 mmol) of 2,2-bis(3-amino-4-hydroxyphenyl)propane (BAP). A molecular weight of the polymer was measured by GPC. A weight-average molecular weight was 34,000 in terms of polystyrene.

[Synthesis Example 3] Synthesis of Polyamide-Imide Resin (A3)

Into a 500-ml flask provided with a stirrer and a thermometer, 28.5 g (77.8 mmol) of 2,2-bis(3-amino-4-hydroxyphenyl)hexafluoropropane (6FAP), 0.9 g (8.2 mmol) of 4-aminophenol (PAP), and 118 g of N-methyl-2-pyrrolidone were added, followed by dissolving by stirring at room temperature. Next, under room temperature, a solution in which 19.0 g (61.4 mmol) of 3,3',4,4'-oxydiphthalic dianhydride (s-ODPA) was dissolved in 192 g of N-methyl-2-pyrrolidone was dropped thereto, followed by stirring for 3 hours under room temperature after dropping. Thereafter, 40 g of xylene was added to the reaction liquid, followed by heating and refluxing for 3 hours while removing water generated at 170° C. outside the system. After cooling to room temperature, 3.2 g (41.0 mmol) of pyridine was added thereto, and 4.9 g (20.5 mmol) of sebacoyl dichloride (DC-1) was dropped thereto so as to keep the temperature to 5° C. or lower. After completion of the dropping, the temperature was returned to room temperature, and the reaction liquid was dropped into 2 L of ultrapure water under stirring. A precipitate was filtered to be washed appropriately with water, followed by drying under reduced pressure at 40° C. for 48 hours. Thus, a polyamide-imide resin (A3) was obtained. A molecular weight of the polymer was measured by GPC. A weight-average molecular weight was 35,000 in terms of polystyrene.

[Synthesis Example 4] Synthesis of Polyamide Resin (A4)

Into a 500-ml flask provided with a stirrer and a thermometer, 28.5 g (77.8 mmol) of 2,2-bis(3-amino-4-hydroxyphenyl)hexafluoropropane (6FAP), 0.9 g (8.2 mmol)

of 4-aminophenol (PAP), and 118 g of N-methyl-2-pyrrolidone were added, followed by dissolving by stirring at room temperature. Next, 13.0 g (163.8 mmol) of pyridine was added thereto, and 19.6 g (81.9 mmol) of sebacoyl dichloride (DC-1) was dropped thereto so as to keep the temperature to 5° C. or lower. After completion of the dropping, the temperature was returned to room temperature, and the reaction liquid was dropped into 2 L of ultrapure water under stirring. A precipitate was filtered to be washed appropriately with water, followed by drying under reduced pressure at 40° C. for 48 hours. Thus, a polyamide resin (A4) was obtained. A molecular weight of the polymer was measured by GPC. A weight-average molecular weight was 38,000 in terms of polystyrene.

[Synthesis Example 5] Synthesis of Tetracarboxylic Diester Compound (X-1)

Into a 3-L flask provided with a stirrer and a thermometer, 100 g (322 mmol) of 3,3',4,4'-oxydiphthalic dianhydride (s-ODPA), 65.2 g (644 mmol) of triethylamine, 39.3 g (322 mmol) of N,N-dimethyl-4-aminopyridine, and 400 g of γ-butyrolactone were added, under stirring at room temperature, 83.8 g (644 mmol) of hydroxyethylmethacrylate (HEMA) was dropped thereto, followed by stirring for 24 hours under room temperature. After that, 370 g of a 10% aqueous solution of hydrochloric acid was dropped under ice cooling to stop the reaction. To the reaction liquid, 800 g of 4-methyl-2-pentanone was added to sample an organic layer, followed by washing 6 times with 600 g of water. A solvent of the obtained organic layer was distilled off and 180 g of a tetracarboxylic diester compound (X-1) was obtained.

[Synthesis Example 6] Synthesis of Polyimide Precursor (A5)

Into a 1-L flask provided with a stirrer and a thermometer, 57.1 g (100 mmol) of (X-1) and 228 g of N-methyl-2-pyrrolidone were added, followed by dissolving by stirring at room temperature. Next, under ice cooling, 24.4 g (205 mmol) of thionyl chloride was dropped thereto so as to keep the reaction solution temperature to 10° C. or lower. After completion of the dropping, the solution was stirred under ice cooling for 2 hours. Subsequently, a solution obtained by dissolving 34.8 g (95 mmol) of 2,2-bis(3-amino-4-hydroxyphenyl)hexafluoropropane (6FAP), 1.1 g (10 mmol) of 4-aminophenol (PAP), and 32.4 g (410 mmol) of pyridine with 144 g of N-methyl-2-pyrrolidone was dropped thereto under ice cooling so as to keep the reaction solution temperature to 10° C. or lower. After completion of the dropping, the temperature was returned to room temperature, and the reaction liquid was dropped into 3 L of water under stirring. A precipitate was filtered to be washed appropriately with water, followed by drying under reduced pressure at 40° C. for 48 hours. Thus, a polyimide precursor (A5) was obtained. A molecular weight of the polymer was measured by GPC. A weight-average molecular weight was 36,000 in terms of polystyrene.

II. Synthesis of Polymer Compound (B)

Synthesis Example

As a crosslinkable polymer compound (polymeric additive), various monomers were combined and copolymerized under a tetrahydrofuran solvent, a crystal was precipitated in hexane, dried, and polymer compounds (polymers B1 to B14 and comparative polymers C1 and C2) of the compositions shown below were obtained. The composition of the obtained polymer compounds was confirmed by 1H-NMR, and the molecular weight of the obtained polymer compounds was confirmed by gel permeation chromatography.

[Synthesis Example 7] Polymer B1

Molecular weight (Mw)=11,400

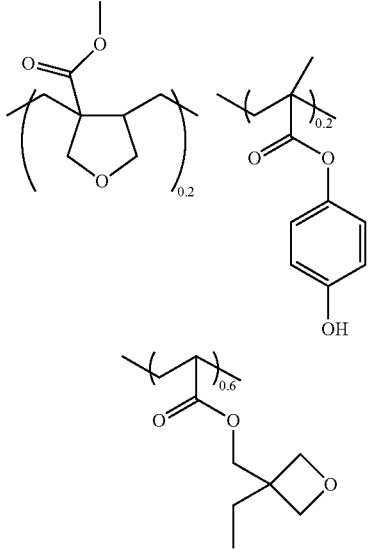

Polymer B1

[Synthesis Example 8] Polymer B2

Molecular weight (Mw)=11,000

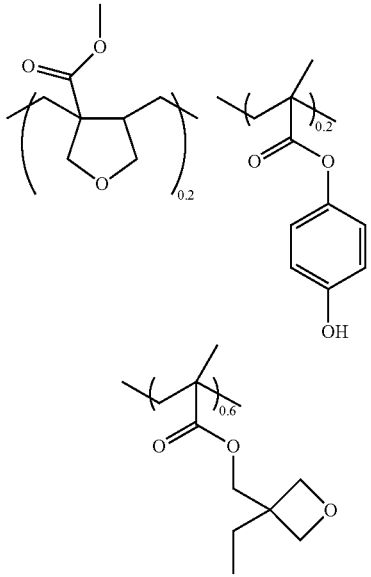

Polymer B2

[Synthesis Example 9] Polymer B3
Molecular weight (Mw)=11,500
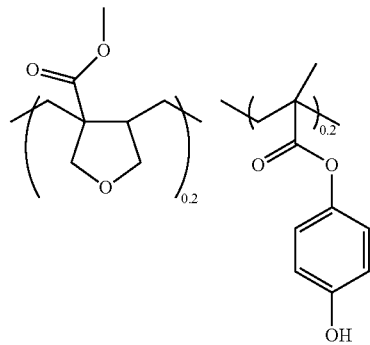
Polymer B3
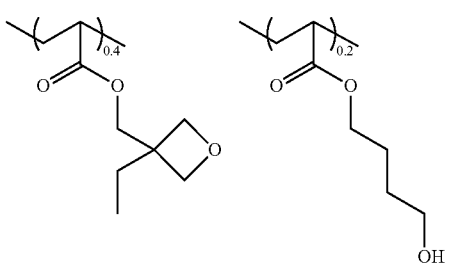
[Synthesis Example 10] Polymer B4
Molecular weight (Mw)=11,400
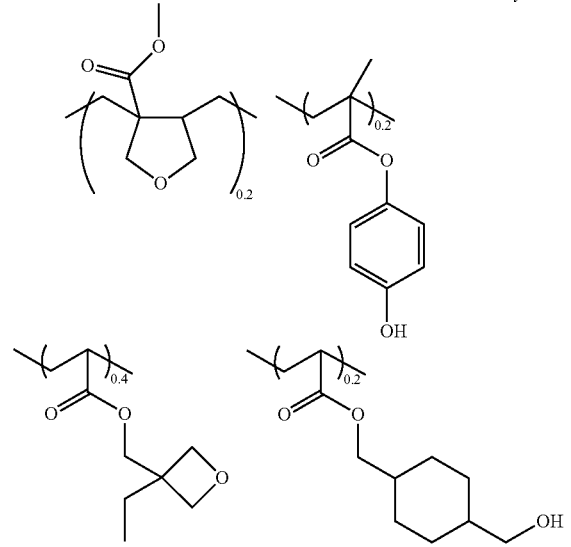
Polymer B4
[Synthesis Example 11] Polymer B5
Molecular weight (Mw)=10,300
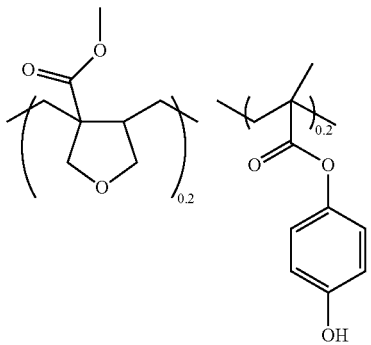
Polymer B5
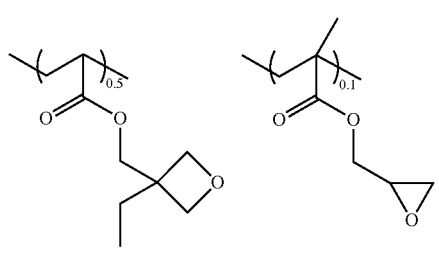
[Synthesis Example 12] Polymer B6
Molecular weight (Mw)=12,000
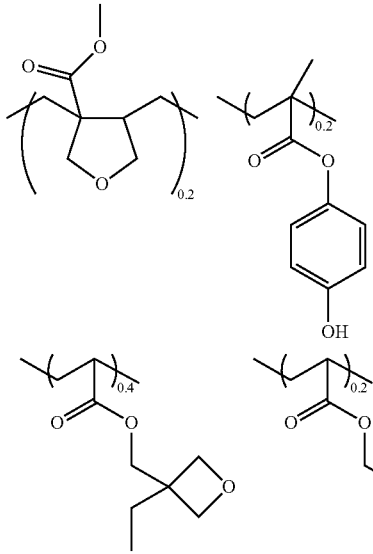
Polymer B6

[Synthesis Example 13] Polymer B7
Molecular weight (Mw)=11,800
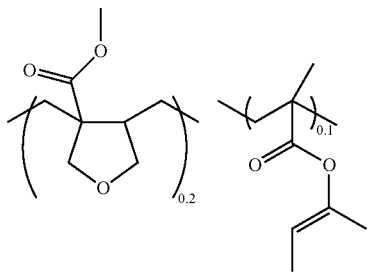
Polymer B7
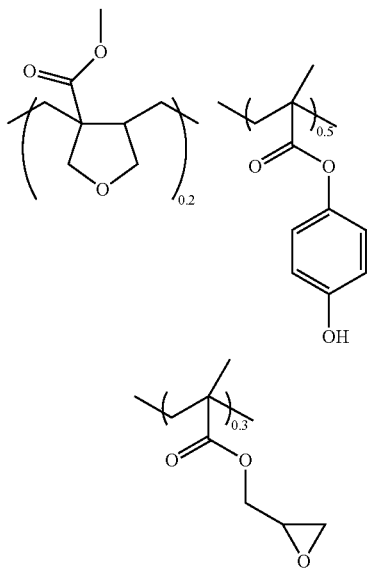
[Synthesis Example 14] Polymer B8
Molecular weight (Mw)=10,800
Polymer B8
[Synthesis Example 15] Polymer B9
Molecular weight (Mw)=12,300
Polymer B9
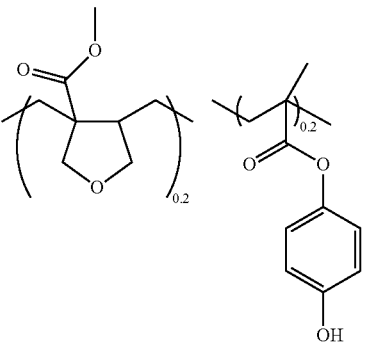
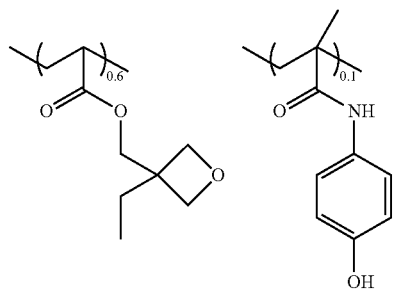
[Synthesis Example 16] Polymer B10
Molecular weight (Mw)=11,800
Polymer B10
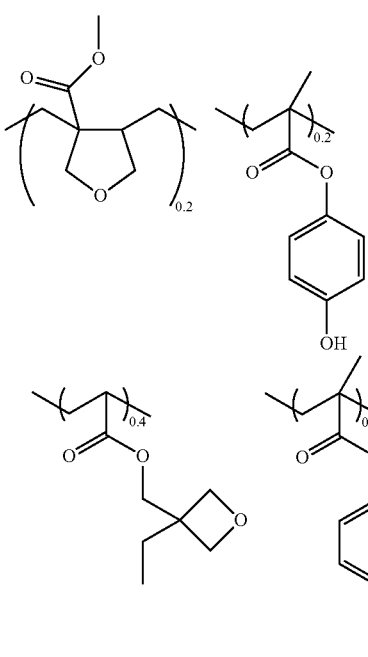

[Synthesis Example 17] Polymer B11
Molecular weight (Mw)=10,700
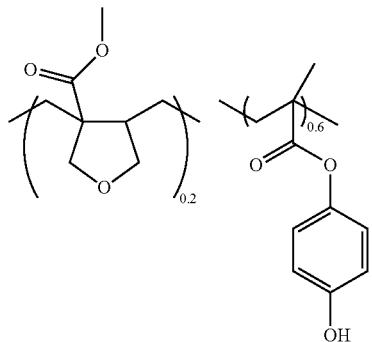
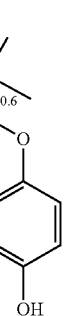
Polymer B11
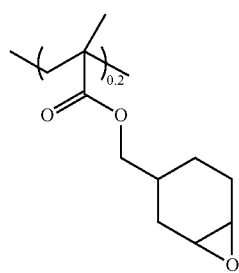
[Synthesis Example 18] Polymer B12
Molecular weight (Mw)=10,400
Polymer B12
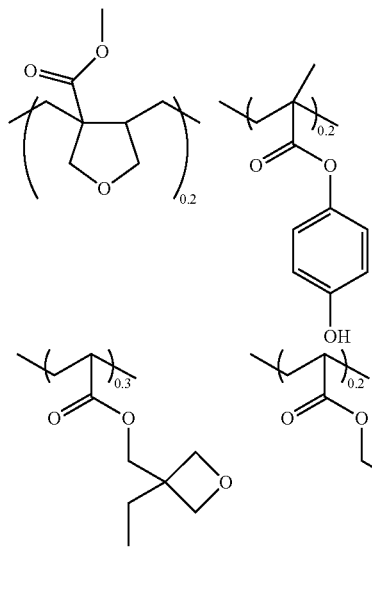
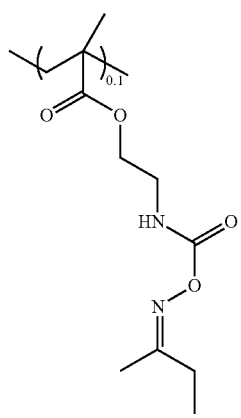
[Synthesis Example 19] Polymer B13
Molecular weight (Mw)=9,400
Polymer B13
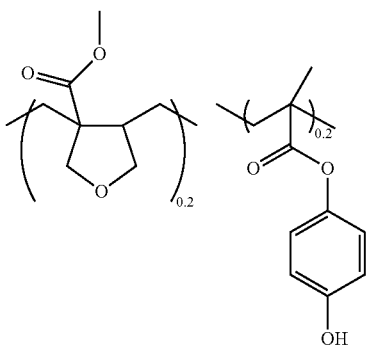
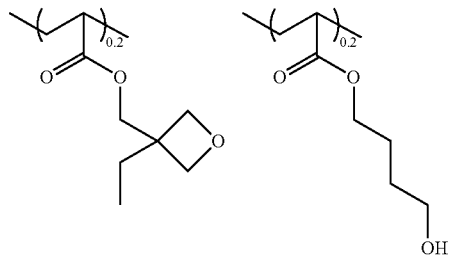
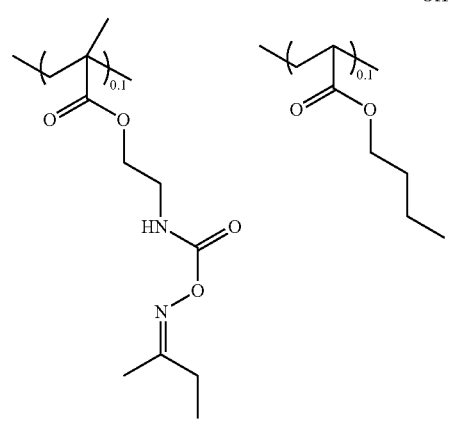

[Synthesis Example 20] Polymer B14

Molecular weight (Mw)=11,000

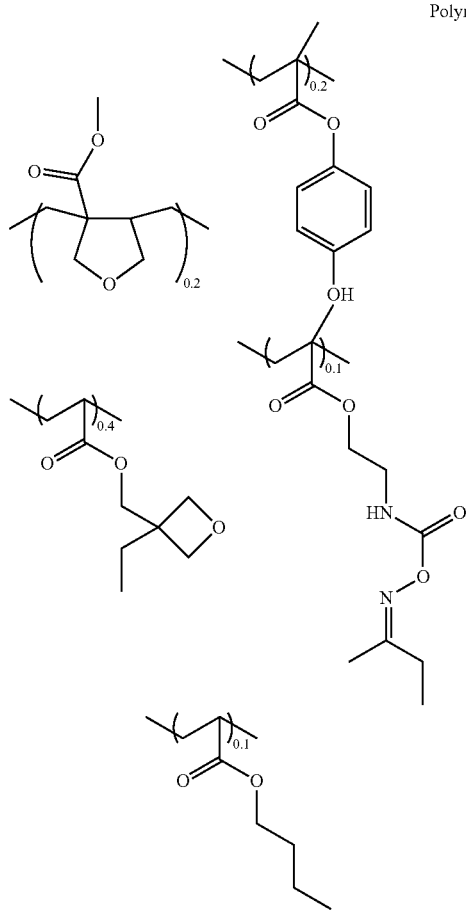

Polymer B14

[Synthesis Example 22] Comparative Polymer C2

Molecular weight (Mw)=11,800

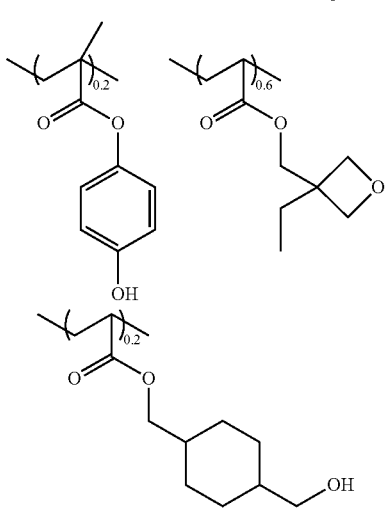

Comparative Polymer C2

[Synthesis Example 21] Comparative Polymer C1

Molecular weight (Mw)=11,300

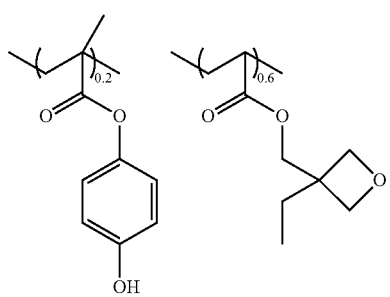

Comparative Polymer C1

III. Preparation of Negative Photosensitive Resin Composition (Examples 1 to 20, Comparative Examples 1 and 2)

70 parts by mass of the alkali-soluble resins (A1) to (A5) synthesized in the Synthesis Example 1 to Synthesis Example 6 and 30 parts by mass of the crosslinkable polymer compounds (B1) to (B14), (C1), and (C2) synthesized in Synthesis Example 7 to Synthesis Example 22 in this proportion were used as a base resin. With the compositions and blending amounts described in Table 1, 20 mass % resin compositions in terms of resin were prepared. Thereafter, after stirring, mixing, and dissolving, microfiltering was applied with a Teflon (registered trade mark) 1.0-μm filter to obtain a negative photosensitive resin composition. In the Table, PGMEA of a solvent represents propylene glycol monomethyl ether acetate and GBL represents γ-butyrolactone.

TABLE 1

| | Resin | | Acid generator Component (C) | Crosslinking agent Component (D) | | Basic compound Component (E) | Thermal acid generator Component (F) | Antioxidant Component (G) | Silane compound Component (H) | Dissolution inhibitor Component (I) | Surfactant Component (J) | Solvent Component (K) | |
|---|---|---|---|---|---|---|---|---|---|---|---|---|---|
| | Component (A) | Component (B) | | | | | | | | | | | |
| Photosensitive resin composition 1 | A1 70 parts by weight | B1 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight | |
| Photosensitive resin composition 2 | A2 70 parts by weight | B1 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight | GBL 525 parts by weight |
| Photosensitive resin composition 3 | A3 70 parts by weight | B1 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight | |
| Photosensitive resin composition 4 | A4 70 parts by weight | B1 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight | |
| Photosensitive resin composition 5 | A5 70 parts by weight | B1 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight | |
| Photosensitive resin composition 6 | A1 70 parts by weight | B1 30 parts by weight | PAG-1 3 parts by weight | CL-1 5 parts by weight | CL-2 5 parts by weight CL-3 10 parts by weight | E-1 1 part by weight | F-1 1 part by weight | | | | J-1 0.02 parts by weight | PGMEA 426 parts by weight | |
| Photosensitive resin composition 7 | A1 70 parts by weight | B1 30 parts by weight | PAG-1 3 parts by weight | CL-1 5 parts by weight | CL-2 5 parts by weight | E-1 1 part by weight | F-2 1 part by weight | | | | J-1 0.02 parts by weight | PGMEA 400 parts by weight | |
| Photosensitive resin composition 8 | A1 70 parts by weight | B2 30 parts by weight | PAG-1 3 parts | CL-1 5 parts by weight | CL-2 5 parts by weight | E-1 1 part by weight | F-1 1 part by weight | | | | J-1 0.02 parts by weight | PGMEA 400 parts by weight | |
| Photosensitive resin composition 9 | A1 70 parts by weight | B3 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight | |
| Photosensitive resin composition 10 | A1 70 parts by weight | B4 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight | |
| Photosensitive resin composition 11 | A1 70 parts by weight | B5 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight | |
| Photosensitive resin composition 12 | A1 70 parts by weight | B6 30 parts by weight | PAG-1 3 parts by weight | CL-1 5 parts by weight | CL-2 5 parts by weight | E-1 1 part by weight | F-1 1 part by weight | G-1 1 part by weight | H-1 0.5 parts by weight | I-1 5 parts by weight | J-1 0.02 parts by weight | PGMEA 400 parts by weight | |
| Photosensitive resin composition 13 | A1 70 parts by weight | B7 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight | |
| Photosensitive resin composition 14 | A1 70 parts by weight | B8 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight | |
| Photosensitive resin | A1 70 parts by weight | B9 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight | |

TABLE 1-continued

| | Resin | | Acid generator Component (C) | Crosslinking agent Component (D) | | Basic compound Component (E) | Thermal acid generator Component (F) | Antioxidant Component (G) | Silane compound Component (H) | Dissolution inhibitor Component (I) | Surfactant Component (J) | Solvent Component (K) |
|---|---|---|---|---|---|---|---|---|---|---|---|---|
| | Component (A) | Component (B) | | | | | | | | | | |
| Photosensitive resin composition 15 | A1 70 parts by weight | B10 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight |
| Photosensitive resin composition 16 | A1 70 parts by weight | B11 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight |
| Photosensitive resin composition 17 | A1 70 parts by weight | B12 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight |
| Photosensitive resin composition 18 | A1 70 parts by weight | B13 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight |
| Photosensitive resin composition 19 | A1 70 parts by weight | B14 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight |
| Photosensitive resin composition 20 | A1 70 parts by weight | C1 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight |
| Comparative photosensitive resin composition 1 | A1 70 parts by weight | C2 30 parts by weight | PAG-1 3 parts by weight | CL-1 5 parts by weight | CL-2 5 parts by weight | E-1 1 part by weight | F-1 1 part by weight | | | | J-1 0.02 parts by weight | PGMEA 400 parts by weight |
| Comparative photosensitive resin composition 2 | A1 | C2 | PAG-1 | CL-1 | CL-2 | E-1 | F-1 | | | | J-1 | PGMEA 400 parts by weight |

In Table 1, details of the photo-acid generator (PAG-1), which is an oximesulfonate compound, the crosslinking agents (CL-1), (CL-2), and (CL-3), the basic compound (E-1), the thermal acid generator (F-1) and (F-2), the antioxidant (G-1), the silane compound (H-1), the dissolution inhibitor (I-1), and the surfactant (J-1) are as follows.

Photo-acid generator (PAG-1)

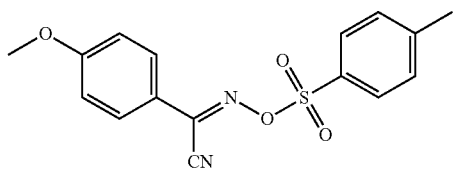

Crosslinking agent (CL-1)

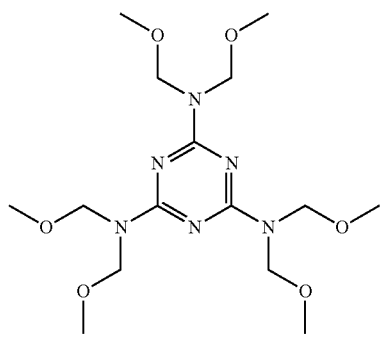

Crosslinking agent (CL-2)

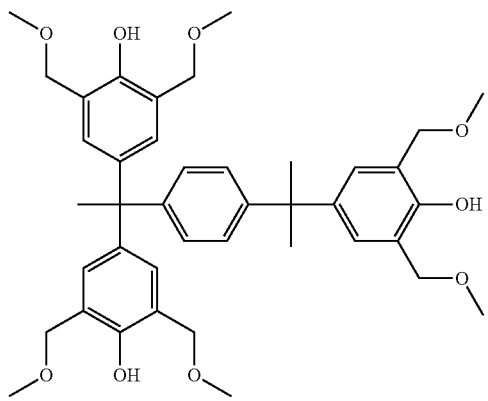

Crosslinking Agent (CL-3)

Oxetane resin: OXT-121 manufactured by TOAGOSEI CO., LTD.

Basic compound (E-1)

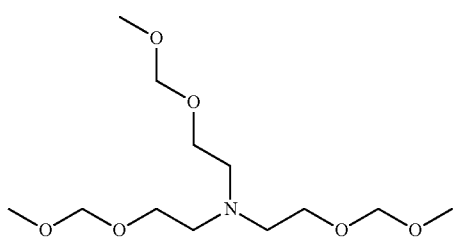

Thermal acid generator (F-1)

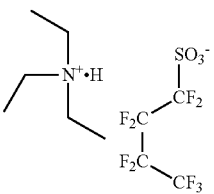

Thermal acid generator (F-2)

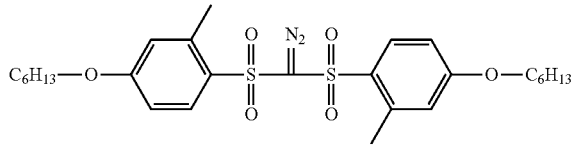

Antioxidant (G-1)
Hindered phenol-based antioxidant: Sumilizer GA-80 manufactured by Sumitomo Chemical Co., Ltd.
Silane Compound (H-1)
Amino silane coupling agent: KBM-573 manufactured by Shin-Etsu Chemical Co., Ltd.

Dissolution inhibitor (I-1)

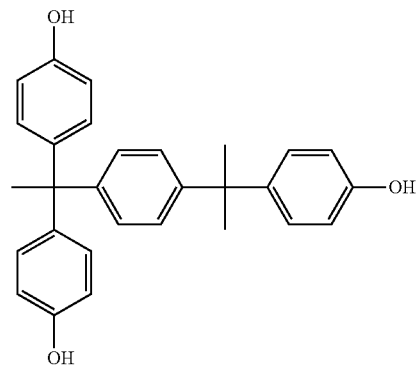

Surfactant (J-1)
Fluorinated surfactant: PF-6320 manufactured by OMNOVA Solutions Inc.

IV. Pattern Formation

By rotating a substrate after each of the photosensitive resin compositions 1 to 20 and comparative photosensitive resin compositions 1 and 2 was dispensed by 5 mL on a silicon substrate treated with hexamethylsilazane, that is, by a spin-coating method, the photosensitive resin composition was applied such that a film thickness was 2 μm after patterning and heating for the post-curing. That is, by studying in advance that after the post-curing step, the film thickness decreases, the rotational rate during coating was adjusted such that a finishing film thickness after the post-curing was 2 μm.

Next, pre-baking was performed on a hot plate at 100° C. for 2 minutes. Then, i-line exposure was carried out using an i-line stepper AP300E manufactured by Veeco Instruments Inc. After the irradiation, post-exposure baking (PEB) was performed at 110° C. for 2 minutes, and the resultant was then cooled. In the pattern formation, a mask for a negative pattern was used. The mask has a pattern which can form a line-and-space pattern (hereinafter, noted as LS pattern) of 2

μm in lengthwise and breadthwise arrangement of 1:1, and can form an LS pattern of 1 μm in increments from 10 μm to 2 μm.

Subsequently, a 2.38% aqueous tetramethylammonium hydroxide (TMAH) solution was used as a developer, and a 1-minute paddle development was carried out until the coating film of the unexposed part was dissolved. Then, rinsing with ultrapure water was carried out.

Subsequently, the substrate with the pattern was post-cured by using an oven at 180° C. for 2 hours while purging with nitrogen.

Next, in order to observe the shape of the obtained LS pattern, each substrate was cut out, and the line pattern shape was observed using a scanning electron microscope (SEM). The shape of the 2-μm LS line pattern after post-curing was evaluated. Together with these results, Table 2 shows the sensitivity and the number of times the development was performed at which the 2-μm pattern was formed.

The shape of the LS pattern was evaluated based on the following criteria, and the evaluation results are shown in Table 2. The pattern cross section of the smallest LS line was observed, and the widths of the pattern cross section at the top and the bottom were compared. When the difference was 0 μm or more and 0.2 μm or less, the pattern was rated as "A", when more than 0.2 μm and 0.5 μm or less, the pattern was rated as "B", when more than 0.5 μm and 1.0 μm or less, the pattern was rated as "C", and when over 1.0 μm, the pattern was rated as "D".

V. Rupture Elongation and Tensile Strength

Each of the photosensitive resin compositions 1 to 20 and the comparative photosensitive resin compositions 1 and 2 was respectively applied onto an aluminum substrate by spin-coating so that a finishing film thickness after curing was 10 μm. Next, pre-baking was performed on a hot plate at 100° C. for 4 minutes to obtain a photosensitive resin film.

Subsequently, contact exposure was performed on the entire surface of the substrate by using a contact aligner UL-7000 manufactured by Quintel Co., Ltd. with a wavelength in a broadband and an exposure dose of 500 mJ/cm$^2$. After irradiation, a PEB treatment was carried out at 110° C. for 4 minutes, and then the substrate was cooled. Thereafter, curing was performed with an oven under the two conditions of 180° C. and 240° C. for 2 hours while purging with nitrogen to obtain a photosensitive resin cured film. Next, a wafer with a cured film was cut in strips of a width of 10 mm and a length of 60 mm, followed by peeling of the cured film from the substrate by dipping in hydrochloric acid of 20 mass %. The obtained cured film was subjected to a measurement of the rupture elongation and tensile strength by using an Autograph AGX-1KN manufactured by Shimadzu Corporation. The measurement was performed 10 times per sample, and an average value thereof is shown in Table 2.

TABLE 2

| | | Pattern shape | Number of times development was performed (Puddle times) | Sensitivity (mJ/cm$^2$) | Curing at 180° C. | | Curing at 240° C. | |
| | | | | | Rupture elongation (%) | Tensile strength (MPa) | Rupture elongation (%) | Tensile strength (MPa) |
|---|---|---|---|---|---|---|---|---|
| Example 1 | Photosensitive resin composition 1 | A | 60 sec × 3 | 860 | 13 | 112 | 20 | 123 |
| Example 2 | Photosensitive resin composition 2 | A | 60 sec × 3 | 940 | 12 | 108 | 21 | 118 |
| Example 3 | Photosensitive resin composition 3 | A | 60 sec × 3 | 800 | 13 | 114 | 20 | 121 |
| Example 4 | Photosensitive resin composition 4 | A | 60 sec × 2 | 820 | 30 | 108 | 35 | 118 |
| Example 5 | Photosensitive resin composition 5 | B | 60 sec × 3 | 900 | 23 | 110 | 30 | 125 |
| Example 6 | Photosensitive resin composition 6 | A | 60 sec × 1 | 920 | 22 | 120 | 28 | 130 |
| Example 7 | Photosensitive resin composition 7 | A | 60 sec × 3 | 800 | 20 | 112 | 26 | 129 |
| Example 8 | Photosensitive resin composition 8 | A | 60 sec × 2 | 900 | 15 | 115 | 22 | 126 |
| Example 9 | Photosensitive resin composition 9 | A | 60 sec × 3 | 980 | 34 | 104 | 39 | 121 |
| Example 10 | Photosensitive resin composition 10 | A | 60 sec × 4 | 970 | 38 | 112 | 40 | 134 |
| Example 11 | Photosensitive resin composition 11 | A | 60 sec × 4 | 980 | 30 | 115 | 35 | 130 |
| Example 12 | Photosensitive resin composition 12 | A | 60 sec × 3 | 900 | 26 | 107 | 31 | 128 |
| Example 13 | Photosensitive resin composition 13 | A | 60 sec × 1 | 980 | 24 | 110 | 30 | 124 |

TABLE 2-continued

| | | Pattern shape | Number of times development was performed (Puddle times) | Sensitivity (mJ/cm$^2$) | Curing at 180° C. | | Curing at 240° C. | |
|---|---|---|---|---|---|---|---|---|
| | | | | | Rupture elongation (%) | Tensile strength (MPa) | Rupture elongation (%) | Tensile strength (MPa) |
| Example 14 | Photosensitive resin composition 14 | A | 60 sec × 3 | 1000 | 28 | 118 | 34 | 131 |
| Example 15 | Photosensitive resin composition 15 | A | 60 sec × 3 | 850 | 28 | 107 | 33 | 121 |
| Example 16 | Photosensitive resin composition 16 | A | 60 sec × 3 | 880 | 29 | 114 | 35 | 123 |
| Example 17 | Photosensitive resin composition 17 | A | 60 sec × 3 | 1080 | 22 | 120 | 30 | 130 |
| Example 18 | Photosensitive resin composition 18 | A | 60 sec × 4 | 850 | 34 | 112 | 40 | 128 |
| Example 19 | Photosensitive resin composition 19 | A | 60 sec × 4 | 850 | 34 | 110 | 39 | 130 |
| Example 20 | Photosensitive resin composition 20 | A | 60 sec × 4 | 850 | 32 | 113 | 40 | 132 |
| Comparative Example 1 | Comparative photosensitive resin composition 1 | A | 60 sec × 2 | 980 | 16 | 102 | 10 | 120 |
| Comparative Example 2 | Comparative photosensitive resin composition 2 | A | 60 sec × 2 | 970 | 23 | 112 | 12 | 122 |

VI. Adhesion

According to the same procedure as the above-described pattern formation, the photosensitive resin compositions 1 to 20 and comparative photosensitive resin compositions 1 and 2 were used. A 1-cm-square square pattern was i-line exposed to obtain a grid-like pattern on the entire surface of the substrate so that a finishing film thickness on the SiN substrate after curing was 5 μm. The exposure dose was the exposure dose at which the smallest pattern was successfully formed, determined in the LS pattern evaluation. In the pre-baking, treatment was performed at 100° C. for 4 minutes, and in the PEB, at 110° C. for 4 minutes. Regarding the development, a 1-minute paddle development was performed until the coating film in the unexposed parts dissolved, over a prescribed number of times.

Subsequently, purging with nitrogen was carried out at 180° C. for 2 hours, and the substrate with the pattern was post-cured. Next, the cured substrate was cut into individual pieces along the 1-cm-square pattern to obtain chips with cured films. An aluminum pin with epoxy resin was made to stand on an obtained chip, this was heated at 150° C. for 1 hour to make the aluminum pin adhere to the chip, and thus, a measurement sample was fabricated. After cooling, adhesive force was measured by using ROMULUS manufactured by Quad Group Inc. according to the method shown in FIG. 1 (hereinafter, noted as the Stud-pull method). As the measurement condition, the measurement was performed at a measurement speed of 20 N/sec. FIG. 1 is an explanatory diagram illustrating the adhesive force measurement method. In FIG. 1, 1 denotes a SiN substrate (a substrate), 2 denotes a cured film, 3 denotes an aluminum pin with adhesive, 4 denotes a support, 5 denotes a grip, and 6 denotes a tensile direction. The obtained value was an average value of ten measurement points. The larger the numerical value, the higher the adhesiveness of the cured film to a SiN substrate. In addition, the adhesive force at the peeling interface of cured film/adhesive is higher than that of substrate/cured film. The obtained numerical values and the peeling interfaces were compared to evaluate the adhesiveness.

Furthermore, as a high temperature and high humidity test, the obtained chip was left to stand under saturation 2 atmospheres at 120° C. in a 100% RH pressure cooker for 168 hours. Subsequently, the adhesive force after the test was evaluated by the Stud-pull method. The results are shown in Table 3 as the adhesive force to a substrate together with the results before the test.

TABLE 3

| | | Adhesive force (MPa) | | Peeling interface | |
|---|---|---|---|---|---|
| | | Before PCT test | After PCT test | Before PCT test | After PCT test |
| Example 1 | Photosensitive resin composition 1 | 53 | 55 | Cured film/adhesive | Cured film/adhesive |

TABLE 3-continued

| | | Adhesive force (MPa) | | Peeling interface | |
|---|---|---|---|---|---|
| | | Before PCT test | After PCT test | Before PCT test | After PCT test |
| Example 2 | Photosensitive resin composition 2 | 54 | 55 | Cured film/adhesive | Cured film/adhesive |
| Example 3 | Photosensitive resin composition 3 | 56 | 55 | Cured film/adhesive | Cured film/adhesive |
| Example 4 | Photosensitive resin composition 4 | 58 | 58 | Cured film/adhesive | Cured film/adhesive |
| Example 5 | Photosensitive resin composition 5 | 54 | 54 | Cured film/adhesive | Cured film/adhesive |
| Example 6 | Photosensitive resin composition 6 | 52 | 53 | Cured film/adhesive | Cured film/adhesive |
| Example 7 | Photosensitive resin composition 7 | 57 | 56 | Cured film/adhesive | Cured film/adhesive |
| Example 8 | Photosensitive resin composition 8 | 56 | 55 | Cured film/adhesive | Cured film/adhesive |
| Example 9 | Photosensitive resin composition 9 | 58 | 57 | Cured film/adhesive | Cured film/adhesive |
| Example 10 | Photosensitive resin composition 10 | 62 | 60 | Cured film/adhesive | Cured film/adhesive |
| Example 11 | Photosensitive resin composition 11 | 53 | 54 | Cured film/adhesive | Cured film/adhesive |
| Example 12 | Photosensitive resin composition 12 | 53 | 54 | Cured film/adhesive | Cured film/adhesive |
| Example 13 | Photosensitive resin composition 13 | 50 | 50 | Cured film/adhesive | Cured film/adhesive |
| Example 14 | Photosensitive resin composition 14 | 54 | 53 | Cured film/adhesive | Cured film/adhesive |
| Example 15 | Photosensitive resin composition 15 | 55 | 54 | Cured film/adhesive | Cured film/adhesive |
| Example 16 | Photosensitive resin composition 16 | 58 | 58 | Cured film/adhesive | Cured film/adhesive |
| Example 17 | Photosensitive resin composition 17 | 53 | 52 | Cured film/adhesive | Cured film/adhesive |
| Example 18 | Photosensitive resin composition 18 | 62 | 64 | Cured film/adhesive | Cured film/adhesive |
| Example 19 | Photosensitive resin composition 19 | 60 | 62 | Cured film/adhesive | Cured film/adhesive |
| Example 20 | Photosensitive resin composition 20 | 64 | 64 | Cured film/adhesive | Cured film/adhesive |
| Comparative Example 1 | Comparative photosensitive resin composition 1 | 48 | 46 | Cured film/adhesive | Cured film/adhesive |
| Comparative Example 2 | Comparative photosensitive resin composition 2 | 44 | 43 | Cured film/adhesive | Cured film/adhesive |

As shown in Table 2, it has been revealed that the inventive negative photosensitive resin composition can give a cured film having excellent mechanical characteristics even when cured at a low temperature of 200° C. or lower. In addition, the inventive negative photosensitive compositions had excellent mechanical characteristics even when cured at a temperature of 240° C., which is relatively high in a low temperature range (100° C. to 300° C.). On the other hand, in Comparative Examples 1 and 2, mechanical characteristics were poor compared with the inventive negative photosensitive compositions at 240° C.

Moreover, as shown in Table 3, it was revealed that the inventive negative photosensitive resin composition can give a cured film having adhesive force and resistance to high temperature and high humidity even when cured at a low temperature of 200° C. or lower. On the other hand, in Comparative Examples 1 and 2, adhesive force was poor compared with the inventive negative photosensitive composition.

From the above results, the following results have been achieved: the compositions of Examples 1 to 20 have favorable rectangularity, show excellent resolution that can resolve fine patterns of 2 μm, and show sufficient properties as photosensitive materials; at the same time, the cured films thereof have substrate adhesiveness and excellent resistance to high temperature and high humidity, and are useful as top coats for circuits and electronic components.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A negative photosensitive resin composition comprising:
    (A) an alkali-soluble resin containing at least one structure selected from a polyimide structure, a polyamide structure, a polybenzoxazole structure, a polyamide-imide structure, and a precursor structure thereof;

(B) a polymer compound having a structural unit formed by cyclopolymerization;

(C) a compound that generates an acid by light; and (D) a heat crosslinking agent, wherein (i) the component (B) has the structural unit formed by cyclopolymerization which is at least one structural unit represented by the following general formula (1), the following general formula (2), the following general formula (3), and the following general formula (4),

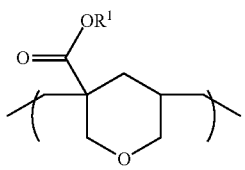

(1)

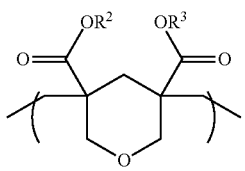

(2)

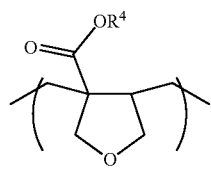

(3)

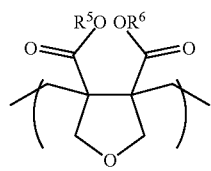

(4)

wherein $R^1$, $R^2$, $R^3$, $R^4$, $R^5$, and $R^6$ each independently represent a hydrogen atom or a linear or branched alkyl group having 1 to 5 carbon atoms; and (ii) the component (B) is an alkali-soluble polymer compound further containing a structural unit represented by the following general formula (5) or (5'),

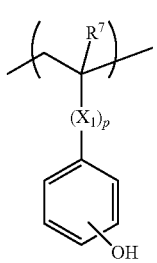

(5)

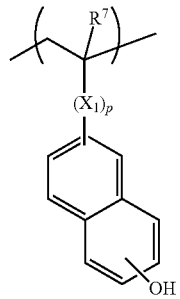

(5')

wherein $R^7$ represents a hydrogen atom or a methyl group; each $X_1$ represents —C(=O)—O—, —C(=O)—O—$R^8$—, —C(=O)—NH—, —C(=O)—NH—$R^8$—, or —C(=O)—N($R^8$OH)—; $R^8$ represents a divalent linear, branched, or cyclic aliphatic saturated hydrocarbon group having 1 to 12 carbon atoms or an aromatic hydrocarbon group having 6 to 12 carbon atoms, wherein a carbon atom of the aliphatic saturated hydrocarbon group is optionally substituted with an oxygen atom; a hydrogen atom of an aromatic hydrocarbon group in the formulae is optionally substituted with a methyl group; and "p" is 1.

2. The negative photosensitive resin composition according to claim 1, wherein the component (B) is a crosslinkable polymer compound further containing one or both of a structural unit represented by the following general formula (6) and a structural unit represented by the following general formula (α),

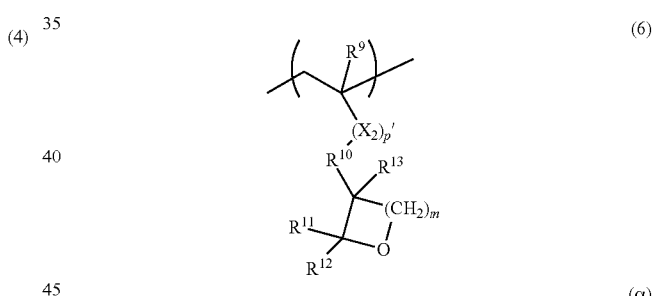

(6)

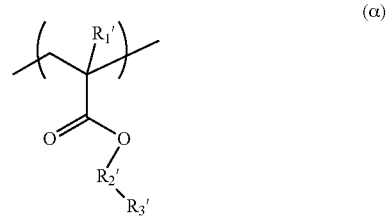

(α)

wherein $R^9$ represents a hydrogen atom or a methyl group; each $X_2$ represents —C(=O)—O—, a phenylene group, or a naphthylene group; $R^{10}$ represents a linear, branched, or cyclic alkylene group having 1 to 15 carbon atoms and optionally containing an ester group, an ether group, or an aromatic hydrocarbon group; $R^{11}$ represents a hydrogen atom, a linear, branched, or cyclic alkyl group having 1 to 6 carbon atoms, or is optionally bonded with $R^{10}$ to form a ring; $R^{12}$ represents a hydrogen atom or a linear, branched, or cyclic alkyl group having 1 to 6 carbon atoms; $R^{13}$ represents a hydrogen atom or a linear alkyl group having 1 to 6 carbon atoms, and is optionally bonded with $R^{10}$ to form a ring; "m" is 0 or 1; "p'" is 0 or 1; $R_1'$ represents a hydrogen atom or a methyl group; $R_2'$ represents a single bond or an alkylene group; and $R_3'$ represents a blocked isocyanate group.

3. The negative photosensitive resin composition according to claim 1, wherein the component (B) is a crosslinking alkali-soluble polymer compound further containing a structural unit represented by the following general formula (7),

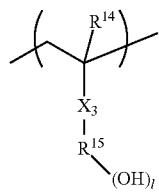
(7)

wherein $R^{14}$ represents a hydrogen atom or a methyl group; $R^{15}$ represents a single bond or a linear, branched, or cyclic aliphatic saturated hydrocarbon group with a valency of (1+1) having 1 to 13 carbon atoms, wherein a carbon atom of the aliphatic saturated hydrocarbon group is optionally substituted with an oxygen atom; each $X_3$ represents —C(=O)—O—, —C(=O)—O—$R^{16}$—, —C(=O)—NH—, —C(=O)—N($R^{16}$OH)—, a phenylene group, or a naphthylene group; $R^{16}$ represents a divalent linear, branched, or cyclic aliphatic saturated hydrocarbon group having 1 to 12 carbon atoms or an aromatic hydrocarbon group having 6 to 12 carbon atoms, wherein a carbon atom of the aliphatic saturated hydrocarbon group is optionally substituted with an oxygen atom; and "l" is 0 or 1.

4. The negative photosensitive resin composition according to claim 1, wherein the component (B) is a crosslinking alkali-soluble polymer compound containing the structural units represented by the following general formula (3), the following general formula (5), one or both of the following general formula (6) and the following general formula (α), and the following general formula (7),

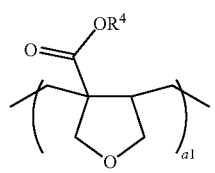
(3)

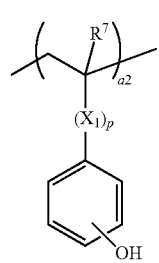
(5)

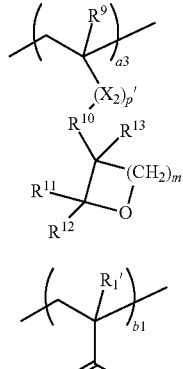
(6)

(α)

(7)

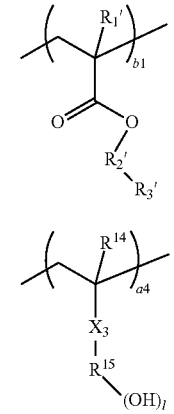

wherein $R^4$ represents a hydrogen atom or a linear or branched alkyl group having 1 to 5 carbon atoms; $R^7$ represents a hydrogen atom or a methyl group; each $X_1$ represents —C(=O)—O—, —C(=O)—O—$R^8$—, —C(=O)—NH—, —C(=O)—NH—$R^8$—, or —C(=O)—N($R^8$OH)—; $R^8$ represents a divalent linear, branched, or cyclic aliphatic saturated hydrocarbon group having 1 to 12 carbon atoms or an aromatic hydrocarbon group having 6 to 12 carbon atoms, wherein a carbon atom of the aliphatic saturated hydrocarbon group is optionally substituted with an oxygen atom; a hydrogen atom of an aromatic hydrocarbon group in the formulae is optionally substituted with a methyl group; $R^9$ represents a hydrogen atom or a methyl group; each $X_2$ represents —C(=O)—O—, a phenylene group, or a naphthylene group; $R^{10}$ represents a linear, branched, or cyclic alkylene group having 1 to 15 carbon atoms and optionally containing an ester group, an ether group, or an aromatic hydrocarbon group; $R^{10}$ represents a hydrogen atom, a linear, branched, or cyclic alkyl group having 1 to 6 carbon atoms, or is optionally bonded with $R^{10}$ to form a ring; $R^{12}$ represents a hydrogen atom or a linear, branched, or cyclic alkyl group having 1 to 6 carbon atoms; $R^{13}$ represents a hydrogen atom or a linear alkyl group having 1 to 6 carbon atoms, and is optionally bonded with $R^{10}$ to form a ring; $R_1'$ represents a hydrogen atom or a methyl group; $R_2'$ represents a single bond or an alkylene group; $R_3'$ represents a blocked isocyanate group; $R^{14}$ represents a hydrogen atom or a methyl group; $R^{15}$ represents a single bond or a linear, branched, or cyclic aliphatic saturated hydrocarbon group with a valency of (1+1) having 1 to 13 carbon atoms, wherein a carbon atom of the aliphatic saturated hydrocarbon group is optionally substituted with an oxygen atom; each $X_3$ represents —C(=O)—O—, —C(=O)—O—$R^{16}$—, —C(=O)—NH—, —C(=O)—N($R^{16}$OH)—, a phenylene group, or a naphthylene group; $R^{16}$ represents a divalent linear, branched, or cyclic aliphatic saturated hydrocarbon group having 1 to 12 carbon atoms or an aromatic hydrocarbon group having 6 to 12 carbon atoms, wherein a carbon atom of the aliphatic saturated hydrocarbon group is optionally substituted with an oxygen atom; "p" is 1; "p'" is 0 or 1; "m" is 0 or 1; "l" is 0 or 1; $0<a1<1.0$, $0<a2<1.0$, $0\leq a3<1.0$, $0\leq b1<1.0$, $0<a3+b1<1.0$, and $0<a4<1.0$; and one of $0<a1+a2+a3+a4\leq 1.0$, $0<a1+a2+b1+a4\leq 1.0$, and $0<a1+a2+a3+b1+a4\leq 1.0$ is satisfied.

5. The negative photosensitive resin composition according to claim 1, wherein the component (D) contains one or more kinds of crosslinking agents selected from an amino condensate modified by formaldehyde or formaldehyde-alcohol; and a phenol compound having two or more methylol groups or alkoxymethylol groups by average in one molecule.

6. The negative photosensitive resin composition according to claim 1, containing 10 to 100 parts by mass of the component (B) relative to 100 parts by mass of the component (A).

7. The negative photosensitive resin composition according to claim 1, further comprising one or more of (E) a basic compound, (F) a thermal acid generator, (G) an antioxidant, and (H) a silane compound.

8. A patterning process comprising:
(1) forming a photosensitive material film by coating a substrate with the negative photosensitive resin composition according to claim 1;
(2) subsequently, after a heat treatment, exposing the photosensitive material film with a high-energy beam having a wavelength of 190 to 500 nm or an electron beam via a photomask; and
(3) after irradiation, developing the substrate, which has been heat-treated, with a developer of an alkaline aqueous solution.

9. A method for forming a cured film comprising:
heating and post-curing a film on which a pattern is formed by the patterning process according to claim 8 at a temperature of 100 to 300° C.

10. An interlayer insulation film being a cured film by curing the negative photosensitive resin composition according to claim 1.

11. A surface protective film being a cured film by curing the negative photosensitive resin composition according to claim 1.

12. An electronic component having the interlayer insulation film according to claim 10.

13. An electronic component having the surface protective film according to claim 11.

* * * * *